(12) United States Patent
Erchak et al.

(10) Patent No.: US 7,692,207 B2
(45) Date of Patent: Apr. 6, 2010

(54) PACKAGING DESIGNS FOR LEDS

(75) Inventors: Alexei A. Erchak, Cambridge, MA (US); Paul Panaccione, Newburyport, MA (US); Robert F. Karlicek, Jr., Chelmsford, MA (US); Michael Lim, Cambridge, MA (US); Elefterios Lidorikis, Newton, MA (US); Jo A. Venezia, Boston, MA (US); Christian Hoepfner, North Andover, MA (US)

(73) Assignee: Luminus Devices, Inc., Billerica, MA (US)

( * ) Notice: Subject to any disclaimer, the term of this patent is extended or adjusted under 35 U.S.C. 154(b) by 897 days.

(21) Appl. No.: 11/210,013

(22) Filed: Aug. 23, 2005

(65) Prior Publication Data

US 2006/0163590 A1 Jul. 27, 2006

Related U.S. Application Data

(60) Provisional application No. 60/645,720, filed on Jan. 21, 2005, provisional application No. 60/645,721, filed on Jan. 21, 2005, provisional application No. 60/659,861, filed on Mar. 8, 2005, provisional application No. 60/660,921, filed on Mar. 11, 2005.

(51) Int. Cl.
*H01L 23/14* (2006.01)

(52) U.S. Cl. ............... 257/99; 257/680; 257/E23.002; 257/E23.191

(58) Field of Classification Search ............... 257/99, 257/680, E23.002, E23.191
See application file for complete search history.

(56) References Cited

U.S. PATENT DOCUMENTS

| | | | |
|---|---|---|---|
| 3,293,513 A | 12/1966 | Biard et al. |
| 3,922,706 A | 11/1975 | Kaiser |
| 4,864,370 A | 9/1989 | Gaw et al. |
| 5,126,231 A | 6/1992 | Levy |
| 5,132,751 A | 7/1992 | Shibata et al. |
| 5,162,878 A | 11/1992 | Sasagawa et al. |
| 5,359,345 A | 10/1994 | Hunter et al. |
| 5,363,009 A | 11/1994 | Monto |
| 5,426,657 A | 6/1995 | Vakhsoori |
| 5,491,350 A | 2/1996 | Unno et al. |
| 5,631,190 A | 5/1997 | Negley et al. |
| 5,633,527 A | 5/1997 | Lear |
| 5,724,062 A | 3/1998 | Hunter et al. |
| 5,779,924 A | 7/1998 | Krames et al. |
| 5,814,839 A | 9/1998 | Hosoba |

(Continued)

FOREIGN PATENT DOCUMENTS

WO 98/14986 4/1998

(Continued)

OTHER PUBLICATIONS

Definition of LED from Chambers 21st Century Dictionary (2001), London: Chambers Harrap., 1 page.*

(Continued)

*Primary Examiner*—Evan Pert
(74) *Attorney, Agent, or Firm*—Wolf, Greenfield & Sacks, P.C.

(57) ABSTRACT

Light-emitting devices, and related components, processes, systems and methods are disclosed.

14 Claims, 20 Drawing Sheets

U.S. PATENT DOCUMENTS

| | | | |
|---|---|---|---|
| 5,834,331 A | 11/1998 | Razeghi | |
| 5,955,749 A | 9/1999 | Joannopoulos et al. | |
| 6,071,795 A | 6/2000 | Cheung et al. | |
| 6,072,628 A | 6/2000 | Sarayeddine | |
| 6,091,085 A | 7/2000 | Lester | |
| 6,122,103 A | 9/2000 | Perkins et al. | |
| 6,222,207 B1 | 4/2001 | Carter-Coman et al. | |
| 6,265,820 B1 | 7/2001 | Ghosh et al. | |
| 6,287,882 B1 | 9/2001 | Chang et al. | |
| 6,288,840 B1 | 9/2001 | Perkins et al. | |
| 6,303,405 B1 | 10/2001 | Yoshida et al. | |
| 6,335,548 B1 | 1/2002 | Roberts et al. | |
| 6,388,264 B1 | 5/2002 | Pace | |
| 6,410,942 B1 | 6/2002 | Thibeault et al. | |
| 6,420,242 B1 | 7/2002 | Cheung et al. | |
| 6,426,515 B2 | 7/2002 | Ishikawa | |
| 6,465,808 B2 | 10/2002 | Lin | |
| 6,469,324 B1 | 10/2002 | Wang | |
| 6,504,180 B1 | 1/2003 | Heremans et al. | |
| 6,522,063 B2 | 2/2003 | Chen et al. | |
| 6,534,798 B1 | 3/2003 | Scherer et al. | |
| 6,559,075 B1 | 5/2003 | Kelly et al. | |
| 6,573,537 B1 | 6/2003 | Steigerwald et al. | |
| 6,574,383 B1 | 6/2003 | Erchak et al. | |
| 6,593,160 B2 | 7/2003 | Carter-Coman et al. | |
| 6,642,618 B2 | 11/2003 | Yagi et al. | |
| 6,649,437 B1 | 11/2003 | Yang et al. | |
| 6,657,236 B1 | 12/2003 | Thibeault et al. | |
| 6,690,268 B2 | 2/2004 | Schofield et al. | |
| 6,740,906 B2 | 5/2004 | Slater, Jr. et al. | |
| 6,742,907 B2 | 6/2004 | Funamoto et al. | |
| 6,762,069 B2 | 7/2004 | Huang et al. | |
| 6,778,746 B2 | 8/2004 | Charlton et al. | |
| 6,784,027 B2 | 8/2004 | Streubel et al. | |
| 6,784,463 B2 | 8/2004 | Camras et al. | |
| 6,791,119 B2 | 9/2004 | Slater, Jr. et al. | |
| 6,794,684 B2 | 9/2004 | Slater, Jr. et al. | |
| 6,825,502 B2 | 11/2004 | Okazaki et al. | |
| 6,828,597 B2 | 12/2004 | Wegleiter et al. | |
| 6,831,302 B2 | 12/2004 | Erchack et al. | |
| 6,847,057 B1 | 1/2005 | Gardner et al. | |
| 6,849,558 B2 | 2/2005 | Schaper | |
| 6,914,261 B2 | 7/2005 | Ho | |
| 6,936,963 B2 * | 8/2005 | Langer et al. | 313/509 |
| 6,967,439 B2 * | 11/2005 | Cok et al. | 313/512 |
| 6,972,518 B2 * | 12/2005 | Heimgartner et al. | 313/512 |
| 7,029,765 B2 * | 4/2006 | Kwong et al. | 428/690 |
| 7,049,745 B2 * | 5/2006 | Cok | 313/512 |
| 7,167,309 B2 * | 1/2007 | Saxena et al. | 359/586 |
| 7,170,100 B2 | 1/2007 | Erchak et al. | |
| 7,345,300 B2 * | 3/2008 | Qin et al. | 257/40 |
| 7,360,936 B2 * | 4/2008 | Abu-Ageel | 362/555 |
| 7,459,850 B2 * | 12/2008 | Cok | 313/512 |
| 2002/0110172 A1 | 8/2002 | Hasnain et al. | |
| 2003/0141507 A1 | 7/2003 | Krames et al. | |
| 2003/0143772 A1 | 7/2003 | Chen | |
| 2003/0222263 A1 | 12/2003 | Choi | |
| 2004/0027062 A1 | 2/2004 | Shiang et al. | |
| 2004/0043524 A1 | 3/2004 | Huang et al. | |
| 2004/0110856 A1 | 6/2004 | Young et al. | |
| 2004/0144985 A1 | 7/2004 | Zhang et al. | |
| 2004/0182914 A1 | 9/2004 | Venugopalan | |
| 2004/0206962 A1 | 10/2004 | Erchak et al. | |
| 2004/0206971 A1 | 10/2004 | Erchak et al. | |
| 2004/0207310 A1 | 10/2004 | Erchak et al. | |
| 2004/0207319 A1 | 10/2004 | Erchak et al. | |
| 2004/0207320 A1 | 10/2004 | Erchak | |
| 2004/0207323 A1 | 10/2004 | Erchak et al. | |
| 2004/0259279 A1 | 12/2004 | Erchak et al. | |
| 2004/0259285 A1 | 12/2004 | Erchak et al. | |
| 2005/0019971 A1 | 1/2005 | Slater, Jr. | |
| 2005/0040424 A1 | 2/2005 | Erchak et al. | |
| 2005/0051785 A1 | 3/2005 | Erchak et al. | |
| 2005/0051787 A1 | 3/2005 | Erchak et al. | |
| 2005/0059178 A1 | 3/2005 | Erchak et al. | |
| 2005/0059179 A1 | 3/2005 | Erchak et al. | |
| 2005/0087754 A1 | 4/2005 | Erchak | |
| 2005/0087757 A1 | 4/2005 | Erchak et al. | |
| 2005/0127375 A1 | 6/2005 | Erchak et al. | |
| 2006/0163590 A1 | 7/2006 | Erchak et al. | |

FOREIGN PATENT DOCUMENTS

| | | |
|---|---|---|
| WO | 02/071450 | 9/2002 |

OTHER PUBLICATIONS

Definiton of LED from Hargrave's Communications Dictionary (2001), Hoboken, NJ: Wiley, 1 page.*

Definition of LED from The American Heritage Dictionary of the English Language (2007), Houghton Mifflin, 1 page.*

Definition of LED from The Penguin English Dictionary (2007), London: Penguin, 1 page.*

International Search Report, from PCT/US2006/00977, mailed Aug. 24, 2006.

Press Release, "Ostar, the compact LED high-power light source", Oct. 2004.

A. A. Erchak et al. "Enhanced coupling to vertical radiation using a two-dimensional photonic crystal in a semiconductor light-emitting diode", Appl. Phys. Lett. (78 (5), Jan. 29, 2001, pp. 563-565.

A. Köck et al., "Novel surface emitting GaAs/AlGaAs laser diodes based on surface mode emission," Appl. Phys. Lett. 63 (9), Aug. 30, 1993, pp. 1164-1166.

A. Köck et al., "Strongly directional emission from AlGaAs/GaAs light-emitting diodes," Appl. Phys. Lett. 57 (22), Nov. 26, 1990, pp. 2327-2329.

Gourley et al. "Optical properties of two-dimensional photonic lattices fabricated as honeycomb nanostructures in compound semiconductors," Appl. Phys. Lett. 64 (6), Feb. 7, 1994, pp. 687-689.

I. Bulu et al. *"Highly directive radiation from sources embedded inside photonic crystals"*, Appl. Phys. Lett. 83 (16), Oct. 20, 2003, pp. 3263-3265.

I. Schnitzer et al. *"30% external quantum efficiency from surface textured, thin-film light-emitting diodes"*, Appl. Phys. Lett. 63 (18), Oct. 18, 1993, pp. 2174-2176.

J.R. Wendt et al. "Nanofabrication of photonic lattice structures in GaAs/AlGaAs", J.Vac. Sci. Technol. B 11(6), Nov./Dec. 1993, pp. 2637-2640.

K. Streubel et al.. "High Brightness AlGaInP Light-Emitting Diodes", IEEE Journal on selected topic in quantum electronics, vol. 8, No. 2, Mar./Apr. 2002, pp. 321-332.

L. Chen et al. "Fabrication of 50-100 nm Patterned InGaN Blue Light Emitting Heterostructures", Phys. Stat. Sol. (a), 188 (1), 2001, pp. 135-138.

M. Boroditsky et al. *"Light extraction from optically pumped light-emitting diode by thin-slab photonic crystals"*, Appl. Phys. Lett. 75 (8), Aug. 23, 1999, pp. 1036-1038.

M. Krames et al "Introduction to the Issue on High-Efficiency Light-Emitting Diodes", IEEE Journal on selected topic in quantum electronics, vol. 8, No. 2 Mar./Apr. 2002, pp. 185-188.

M. Okai et al. "Novel method to fabricate corrugation for a λ/4-shifted distributed feedback laser using a granting photomask", Appl. Phys. Lett. 55(5), Jul. 31, 1989, pp. 415-417.

M. Rattier et al. "Omnidirectional and compact guided light extraction from Archimedean photonic lattices", Appl. Phys. Lett. 83 (7), Aug. 18, 2003, pp. 1283-1285.

M. Zelsmann et al. "Seventy-fold enhancement of light extraction from a defectless photonic crystal made on silicon-on-insulator", Appl. Phys. Lett. 83 (13), Sep. 29, 2003, pp. 2542-2544.

M.K. Kelly et al. "Optical patterning of GaN films", Appl. Phys. Lett 68 (12), Sep. 16, 1996, pp. 1749-1751.

M.K. Kelly et al. "Optical process for liftoff of Group III-nitride films", Physica Status Solidi; Rapid Research Note, Nov. 28, 1996, 2 pages.

P.L. Gourley et al. "Optical Bloch waves in a semiconductor photonic lattice", Appl. Phys. Lett. 60 (22), Jun. 1, 1992, pp. 2714-2716.

T. N. Oder et al. "*III-nitride photonic crystals*", Appl. Phys. Lett. 83 (6), Aug. 11, 2003, pp. 1231-1233.

T.L. Koch et al. "1.55-µ InGaAsP distributed feedback vapor phase transported buried heterostructure lasers", Appl. Phys. Lett. 47 (1), Jul. 1, 1985, pp. 12-14.

W.S. Wong et al. "Damage-free separation of GaN thin films from sapphire substrates", Appl. Phys. Lett. 72 (5), Feb. 2, 1998, pp. 599-601.

W.T. Tsang et al. "Semiconductor distributed feedback lasers with quantum well or superlattice grating for index or gain-coupled optical feedback", Appl. Phys. Lett. 60 (21), May 25, 1992, pp. 258-2582.

Y.-J. Lee et al. "A high-extraction-efficiency nanopatterned organic light-emitting diode", Appl. Phys. Lett. 82(21), May 26, 2003, pp. 3779-3781.

\* cited by examiner

US 7,692,207 B2

PACKAGING DESIGNS FOR LEDS

CROSS-REFERENCE TO RELATED APPLICATIONS

This application claims priority under 35 U.S.C. §119 to U.S. Provisional Patent Application Ser. No. 60/645,720, filed Jan. 21, 2005, and entitled "PACKAGING DESIGNS FOR LEDS", U.S. Provisional Patent Application Ser. No. 60/645,721, filed Jan. 21, 2005, and entitled "PACKAGING DESIGNS FOR LEDS", U.S. Provisional Patent Application Ser. No. 60/659,861, filed Mar. 8, 2005, and entitled "LIGHT EMITTING DEVICE MULTI-CHIP ARRAYS", and U.S. Provisional Patent Application Ser. No. 60/660,921, filed Mar. 11, 2005, and entitled "LIGHT EMITTING DEVICE MULTI-CHIP ARRAYS", the entire contents of which are hereby incorporated by reference.

INCORPORATION BY REFERENCE

This application incorporates by reference the following U.S. Provisional Patent Applications: 60/503,653, filed Sep. 17, 2003; 60/503,654 filed Sep. 17, 2003; 60/503,661, filed Sep. 17, 2003; 60/503,671, filed Sep. 17, 2003; 60/503,672, filed Sep. 17, 2003; 60/513,807, filed Oct. 23, 2003; 60/514,764, filed Oct. 27, 2003, 60/553,894, filed Mar. 16, 2004; 60/603,087, filed Aug. 20, 2004; 60/605,733, filed Aug. 31, 2004; 60/645,720 filed Jan. 21, 2005; 60/645,721 filed Jan. 21, 2005; 60/659,861 filed Mar. 8, 2005; 60/660,921 filed Mar. 11, 2005; 60/659,810 filed Mar. 8, 2005; and 60/659,811 filed Mar. 8, 2005. This application also incorporates by reference the following U.S. Patent Applications: U.S. Ser. No. 10/723,987, entitled "Light Emitting Devices," and filed Nov. 26, 2003; U.S. Ser. No. 10/724,004, entitled "Light Emitting Devices," and filed Nov. 26, 2003; U.S. Ser. No. 10/724,033, entitled "Light Emitting Devices," and filed Nov. 26, 2003; U.S. Ser. No. 10/724,006, entitled "Light Emitting Devices," and filed Nov. 26, 2003; U.S. Ser. No. 10/724,029, entitled "Light Emitting Devices," and filed Nov. 26, 2003; U.S. Ser. No. 10/724,015, entitled "Light Emitting Devices," and filed Nov. 26, 2003; U.S. Ser. No. 10/724,005, entitled "Light Emitting Devices," and filed Nov. 26, 2003; U.S. Ser. No. 10/735,498, entitled "Light Emitting Systems," and filed Dec. 12, 2003; U.S. Ser. No. 10/794,244, entitled "Light Emitting Device Methods" and filed Mar. 5, 2004; U.S. Ser. No. 10/794,452, entitled "Light Emitting Device Methods" and filed Mar. 5, 2004; U.S. Ser. No. 10/872,335, entitled "Optical Display Systems and Methods" and filed Jun. 18, 2004; U.S. Ser. No. 10/871,877, entitled "Electronic Device Contact Structures" and filed Jun. 18, 2004; and U.S. Ser. No. 10/872,336, entitled "Light Emitting Diode Systems" and filed Jun. 18, 2004.

TECHNICAL FIELD

The invention relates to light-emitting devices, and related components, processes, systems and methods.

BACKGROUND

A light emitting diode (LED) often can provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers determine the wavelength(s) of light emitted by the LED. In addition, the chemical composition of the layers can be selected to try to isolate injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

A common approach to preparing an LED is as follows. The layers of material are prepared in the form of a wafer. Typically, the layers are formed using an epitaxial deposition technique, such as metal-organic chemical vapor deposition (MOCVD), with the initially deposited layer being formed on a growth substrate. The layers are then exposed to various etching and metallization techniques to form contacts for electrical current injection, and the wafer is subsequently sectioned into individual LED chips. Usually, the LED chips are packaged.

During use, electrical energy is usually injected into an LED and then converted into electromagnetic radiation (light), some of which is extracted from the LED.

SUMMARY

The invention relates to light-emitting devices, and related components, systems and methods.

In some embodiments, a system includes a light emitting device that includes a multi-layer stack of materials and a package containing the multi-layer stack of materials. The multi-layer stack of materials includes a light generating region. The package includes a layer configured so that at least about 75% of the light that that emerges from the light emitting device and impinges on the layer passes through the layer. The layer is disposed such that a distance between the surface of the light emitting device and a surface of the layer nearest to the surface of the light emitting device is from about five microns to about 400 microns.

In some embodiments, a system includes a light emitting device that includes a multi-layer stack of materials including a light generating region. The light emitting device has a surface and an edge. The system also includes a package containing the multi-layer stack of materials. The package includes a layer configured so that at least about 75% of the light that that emerges from the light emitting device and impinges on the layer passes through the layer. The layer is positioned such that a ratio of the length of the edge to a distance between the surface of the light emitting device and a surface of the layer nearest to the surface of the light emitting device is at least about 10.

In some embodiments, a system includes an LED having a surface. The LED is capable of radiating light at a wavelength. The system also includes a layer positioned from about five microns to about 400 microns from the surface of the LED. The layer is configured so that at least about 75% of the light that that emerges from the light emitting device and impinges on the layer passes through the layer.

In some embodiments, a system includes an LED having an edge. The LED is capable of radiating light at a wavelength. The system also includes a layer positioned at a distance from the surface of the LED. The distance can be at most about 10% of the length of the edge and the layer can be configured so that at least about 75% of the light that that emerges from the light emitting device and impinges on the layer passes through the layer.

Embodiments can include one or more of the following.

The multi-layer stack of materials can include a first layer supported by the light generating region. A surface of the first layer can be configured so that light generated by the light generating region can emerge from the light emitting device via a surface of the first layer. The surface of the first layer can have a dielectric function that varies spatially according to a pattern. The pattern can have an ideal lattice constant and a detuning parameter with a value greater than zero. The surface of the first layer can have a dielectric function that varies spatially according to a nonperiodic pattern. The surface of the first layer can have a dielectric function that varies spatially according to a quasicrystalline pattern. The surface of the first layer can have a dielectric function that varies spatially according to a complex periodic pattern. The surface of the first layer can have a dielectric function that varies spatially according to a periodic pattern.

The light emitting device can have an edge that is at least about one millimeter long. The light emitting device can have an edge that is at least about 1.5 millimeters.

The layer can include at least one optical component. The optical component can include a photonic lattice, a color filter, a polarization selective layer, a wavelength conversion layer, and/or an anti-reflective coating.

An aspect ratio of the surface of the light emitting device can be about 4×3. An aspect ratio of the surface of the light emitting device can be about 16×9. An aspect ratio of the surface of the light emitting device can be 4×3. An aspect ratio of the surface of the light emitting device can be 16×9.

The package can also include a heat sink layer. The package can be mounted on a heat sink device. The package can include a package substrate. The package substrate can be formed of Al, N, Cu, C, Au or combinations thereof. The package can be mounted on a thermoelectric cooler. The light emitting device can be a light emitting diode. The light emitting diode can be a photonic lattice light emitting diode. The light emitting device can be a surface emitting laser. The light emitting device can be a light emitting diode, a laser, an optical amplifier, and/or combinations thereof. The light emitting device can be an OLED, a flat surface-emitting LED, a HBLED, and/or combinations thereof. The system can also include a cooling system configured so that, during use, the cooling system regulates a temperature of the light emitting diode.

The distance between the surface of the light emitting device and the surface of the layer nearest to the surface of the light emitting device can be from about five microns to about 300 microns. The distance between the surface of the light emitting device and the surface of the layer nearest to the surface of the light emitting device can be from about five microns to about 200 microns. The distance between the surface of the light emitting device and the surface of the layer nearest to the surface of the light emitting device can be from about five microns to about 100 microns. The distance between the surface of the light emitting device and the surface of the layer nearest to the surface of the light emitting device can be from about 50 microns to about 100 microns.

The ratio of the length of the edge to the distance between the surface of the light emitting device and the surface of the layer nearest to the surface of the light emitting device can be at least about 20. The ratio of the length of the edge to the distance between the surface of the light emitting device and the surface of the layer nearest to the surface of the light emitting device can be at least about 50.

In some embodiments, a system includes a substrate and an array of light emitting devices supported by the substrate. The array has an outer perimeter that defines an area and the array of light emitting devices are positioned such that a ratio of a sum of a total area of all of the light emitting devices in the array of light emitting devices to the area defined by the outer perimeter is at least about 0.75.

In some embodiments, a system includes an array of light emitting devices including a pair of light emitting devices having a pair of nearest edges. At least some of the light emitting devices in the array of light emitting devices having an edge that is at least about 1 mm long. The system also includes a substrate supporting the array of light emitting devices such that a distance between the nearest edges of the pair of adjacent the light emitting devices is at most about 200 microns.

In some embodiments, a system includes an array of light emitting devices including a first rectangular light emitting device having a first edge and a second edge. The first edge of the first light emitting device is approximately perpendicular to the second edge of the first light emitting device. The system also includes a second rectangular light emitting device having a first edge and a second edge. The first edge of the second light emitting device is approximately perpendicular to the second edge of the second light emitting device. The second light emitting device is disposed such that the second edge of the second light emitting device is approximately parallel to the second edge of the first light emitting device and a distance between the second edge of the second light emitting and the second edge of the first light emitting device is at most about 200 microns. The system also includes a third rectangular light emitting device having a first edge and a second edge. The first edge of the third light emitting device is approximately perpendicular to the second edge of the third light emitting device. The third light emitting device is disposed such that the first edge of the third light emitting device is approximately parallel to the first edge of the first light emitting device and a distance between the first edge of the third light emitting and the first edge of the first light emitting device is at most about 200 microns. The system also includes a fourth rectangular light emitting device having a first edge and a second edge. The first edge of the fourth light emitting device is approximately perpendicular to the second edge of the fourth light emitting device. The fourth light emitting device is disposed such that the first edge of the fourth light emitting device is approximately parallel to the first edge of the second light emitting device and a distance between the first edge of the fourth light emitting device and the first edge of the second light emitting device is at most about 200 microns and the second edge of the fourth light emitting device is approximately parallel to the second edge of the third light emitting device and a distance between the second edge of the fourth light emitting device and the second edge of the third light emitting device is at most about 200 microns. The system also includes a package containing the array of light emitting devices, the package having a layer configured so that at least about 75% of the light that that emerges from the light emitting device and impinges on the layer passes through the layer.

Embodiments can include one or more of the following.

The system can include a package containing the substrate and the array of light emitting devices. The array of light emitting devices can include four light emitting devices. The array of light emitting devices can consist of four light emitting devices. The four light emitting devices can be disposed in a rectangular matrix having two rows and two columns. The four light emitting devices can be disposed in a rectangular matrix having one row and four columns. The array of light emitting devices can include six light emitting devices. The array of light emitting devices can consist of six light emitting devices. The six light emitting devices can be disposed in a rectangular matrix having two rows and three columns. The six light emitting devices can be disposed in a rectangular matrix having one row and six columns. The array of light emitting devices can consist of 2*N light emitting devices where N is a positive integer and the 2*N light-emitting devices disposed in a rectangular matrix having N rows and two columns.

The array of light emitting devices can include a red light emitting device, a green light emitting device, and a blue light emitting device. An aspect ratio of the array of light emitting devices can be about 16:9. An aspect ratio of the array of light emitting devices can be about 4×3. An aspect ratio of each of the light emitting devices in the array of light emitting devices can be about 4×3. An aspect ratio of each of the light emitting devices in the array of light emitting devices can be about 16×9.

The system can also include a package containing the substrate and the array of light emitting devices. The package can have a layer configured so that at least about 75% of the light that that emerges from the light emitting device and impinges on the layer passes through the layer. The layer can be disposed such that a ratio of a length of an edge to a distance between a surface of the light emitting device and a surface of the layer is at least about 10. The layer can be disposed such that a distance between the surface of the array of light emitting devices and a surface of the layer nearest to the surface of the array of light emitting devices is from about five microns to about 400 microns.

The package can also include a heat sink layer. The package can be mounted on a heat sink device. The package can include a package substrate. The package substrate can be formed of Al, N, Cu, C, Au or combinations thereof. The package can be mounted on a thermoelectric cooler. At least one of the light emitting devices in the array of light emitting devices can be a light emitting diode. At least one of the light emitting devices in the array of light emitting devices can be a photonic lattice light emitting diode. At least one of the light emitting devices in the array of light emitting devices can be a surface emitting laser. At least one of the light emitting devices in the array of light emitting devices can be a light emitting diode, a laser, an optical amplifier, and/or combinations thereof. At least one of the light emitting devices in the array of light emitting devices can be an OLED, a flat surface-emitting LED, a HBLED, and/or combinations thereof. The system can also include a cooling system configured so that, during use, the cooling system regulates a temperature of the light emitting diode.

At least one of the light emitting devices in the array of light emitting devices can include a multi-layer stack of materials that includes a first layer supported by the light generating region. A surface of the first layer can be configured so that light generated by the light generating region can emerge from the light emitting device via a surface of the first layer. The surface of the first layer can have a dielectric function that varies spatially according to a pattern. The pattern can have an ideal lattice constant and a detuning parameter with a value greater than zero. The surface of the first layer can have a dielectric function that varies spatially according to a nonperiodic pattern. The surface of the first layer can have a dielectric function that varies spatially according to a quasicrystalline pattern. The surface of the first layer can have a dielectric function that varies spatially according to a complex periodic pattern. The surface of the first layer can have a dielectric function that varies spatially according to a periodic pattern.

The array of light emitting devices can include a plurality of light emitting devices connected electrically in series. The array of light emitting devices can include a plurality of light emitting devices connected electrically in parallel.

The layer can be disposed such that a ratio of a length of an edge to a distance between a surface of the light emitting device and a surface of the layer is at least about 10. The layer can be disposed such that that a distance between the surface of the array of light emitting devices and a surface of the layer nearest to the surface of the array of light emitting devices is from about five microns to about 400 microns.

The array of light emitting devices can also include a fifth rectangular light emitting device having a first edge and a second edge. The first edge of the fifth light emitting device can be approximately perpendicular to a second edge of the fifth light emitting device. The fifth light emitting device can be disposed such that the first edge of the fifth light emitting device is approximately parallel to a third edge of the second light emitting device and a distance between the first edge of the fifth light emitting and the third edge of the second light emitting device is at most about 200 microns. The array of light emitting devices can also include a sixth rectangular light emitting device having a first edge and a second edge. The first edge of the sixth light emitting device can be approximately perpendicular to the second edge of the sixth light emitting device. The sixth light emitting device can be disposed such that the first edge of the sixth light emitting device is approximately parallel to the second edge of the fifth light emitting device and a distance between the first edge of the sixth light emitting device and the second edge of the fifth light emitting device is at most about 200 microns and the second edge of the sixth light emitting device is approximately parallel to a third edge of the fourth light emitting device and a distance between the second edge of the sixth light emitting device and the third edge of the fourth light emitting device is at most about 200 microns.

Features and advantages of the invention are in the description, drawings and claims.

In some embodiments, multiple LEDs form a closely packed array. Closely packing multiple LEDs to form an array can provide various advantages. For example, if one LED does not function (e.g., due to a defect or malfunction), the failure of the LED may not significantly diminish the performance of the array because the individual devices are closely packed. Closely packing LEDs can also increase light output for a given array area because the light emitting area is increased relative to the non-light emitting area. In some embodiments, a system can include a single LED of a predetermined size. In some embodiments, a system can include multiple LEDs electrically connected in series and having a combined surface area about equal to the predetermined size of the single LED. Electrically connecting the array in series can allow a lower current to be used to operate the array. By decreasing the space between the die, the total light emission from the array can be increased.

In some embodiments, a transparent cover is in close proximity to an upper surface of an LED. Placing the transparent cover is in close proximity to the LED can provide advantages in the transmission of light through the cover and also allows additional optical components to be placed within a short distance from the LED. The close proximity of the optical components to the LED provides the advantage of reducing loss and increasing light coupling into the optical components. In some embodiments, the window can be replaced by an optical component (e.g., filter, lens, fiber optic). The optical component can be sealed in the package. Replacing the transparent cover with an optical component can provide the advantage of reducing the separation between the surface of the LED and the optical component. Placing the transparent cover close to the die can also reduce light absorption from the package (e.g., absorption by the internal edges of the package).

In some embodiments, forming electrical non-wire bonded contacts allows the transparent cover to be disposed in contact with the LED.

In some embodiments, multiple die can be closely spaced on a substrate without shorting the die by using various die attach methods.

DETAILED DESCRIPTION

Figure 1:
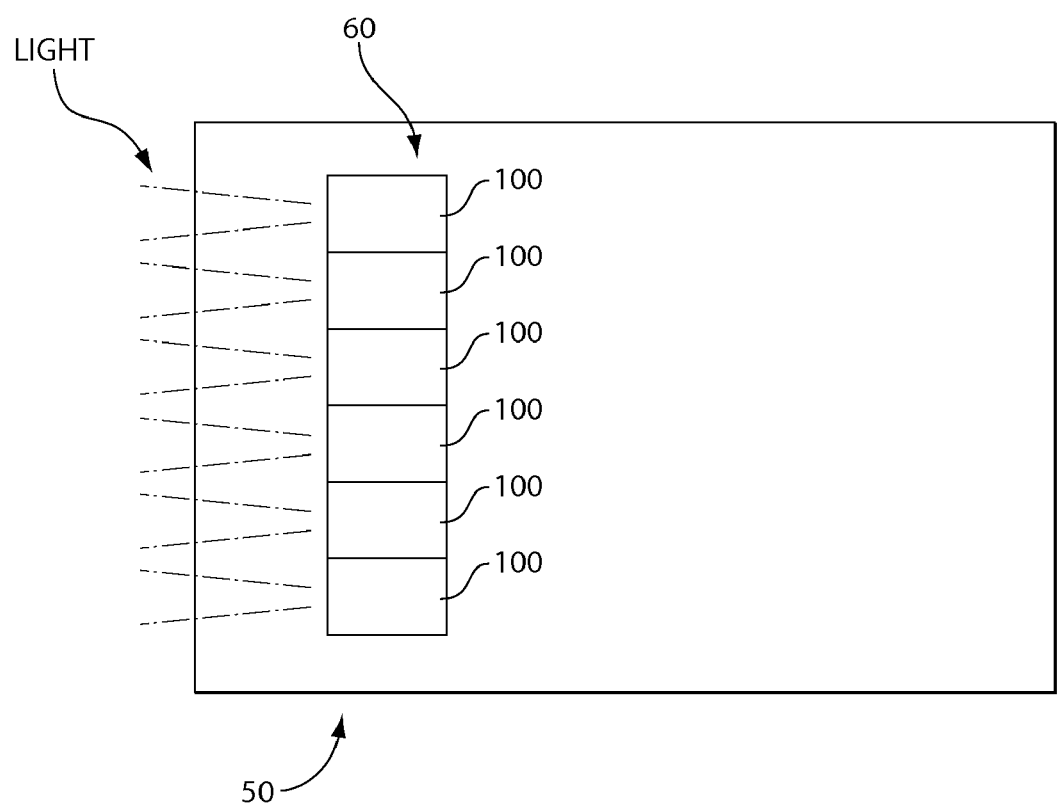
FIG. 1 is a schematic representation of a light-emitting system.

FIG. 1 is a schematic representation of a light-emitting system 50 that has an array 60 of LEDs 100 incorporated therein. Array 60 is configured so that, during use, light that emerges from LEDs 100 emerges from system 50.

Examples of light-emitting systems include projectors (e.g., rear projection projectors, front projection projectors), portable electronic devices (e.g., cell phones, personal digital assistants, laptop computers), computer monitors, large area signage (e.g., highway signage), vehicle interior lighting (e.g., dashboard lighting), vehicle exterior lighting (e.g., vehicle headlights, including color changeable headlights), general lighting (e.g., office overhead lighting), high brightness lighting (e.g., streetlights), camera flashes, medical devices (e.g., endoscopes), telecommunications (e.g. plastic fibers for short range data transfer), security sensing (e.g. biometrics), integrated optoelectronics (e.g., intrachip and interchip optical interconnects and optical clocking), military field communications (e.g., point to point communications), biosensing (e.g. photo-detection of organic or inorganic substances), photodynamic therapy (e.g. skin treatment), night-vision goggles, solar powered transit lighting, emergency lighting, airport runway lighting, airline lighting, surgical goggles, wearable light sources (e.g. life-vests). An example of a rear projection projector is a rear projector television. An example of a front projection projector is a projector for displaying on a surface, such as a screen or a wall. In some embodiments, a laptop computer can include a front projection projector.

Although depicted in FIG. 1 as being in the form of an array, LEDs 100 can be configured differently. As an example, in some embodiments, system 50 includes a single LED 100.

Figure 2:
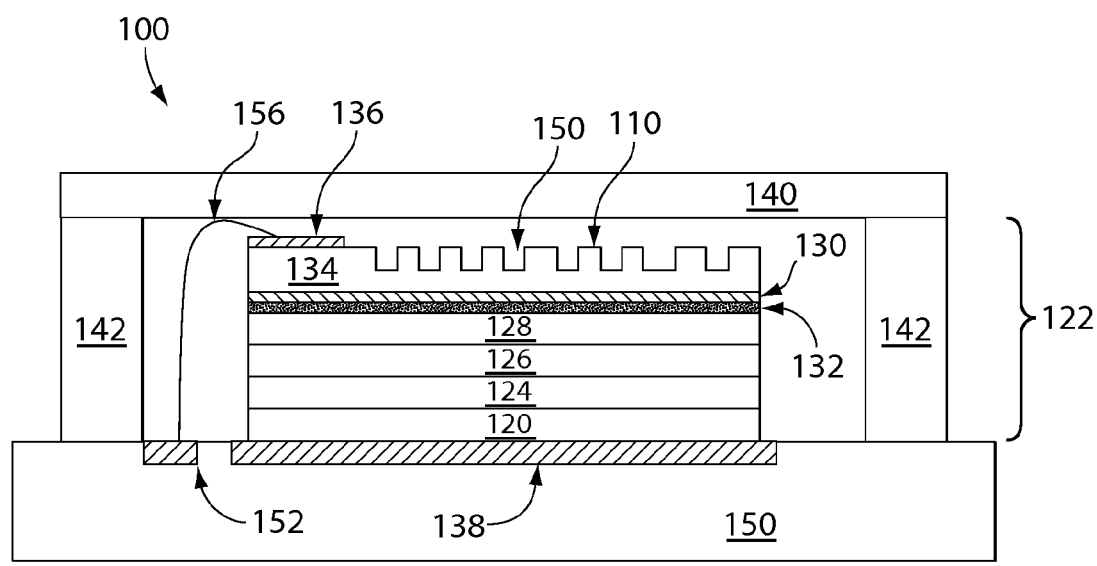
FIG. 2 is a cross-sectional view a packaged light emitting device.

FIG. 2 shows a side view of an LED 100 in the form of a packaged die. LED 100 includes a multi-layer stack 122 disposed on a submount 120. Multi-layer stack 122 includes a 320 nm thick silicon doped (n-doped) GaN layer 134 having a pattern of openings 150 in its upper surface 110. Multi-layer stack 122 also includes a bonding layer 124, a 100 nm thick silver layer 126, a 40 nm thick magnesium doped (p-doped) GaN layer 128, a 120 nm thick light-generating region 130 formed of multiple InGaN/GaN quantum wells, and a AlGaN layer 132. An n-side contact pad 136 is disposed on layer 134. Packaged LED 100 also includes a package substrate 150 and metallized portions 152 and 138 supported by substrate 150. Metallized portion 152 is electrically connected to n-side contact 136 using a connector 156, for example, a wire bond. Metallized portion 138 is in electrical contact with conductive submount 120 and forms an electrical current path to p-doped layer 128. A frame 142 is supported by substrate 150. Frame 142 supports a transparent cover 140. Typically, transparent cover 140 is formed of a material that transmits at least about 60% (e.g., at least about 70%, at least about 80%, at least about 90%, at least about 95%) of the light that emerges from LED 100 and impinges on transparent cover 140.

Light is generated by LED 100 as follows. P-side contact 138 is held at a positive potential relative to n-side contact 136, which causes electrical current to be injected into LED 100. As the electrical current passes through light-generating region 130, electrons from n-doped layer 134 combine in region 130 with holes from p-doped layer 128, which causes region 130 to generate light. Light-generating region 130 contains a multitude of point dipole radiation sources that emit light (e.g., isotropically) within region 130 with a spectrum of wavelengths characteristic of the material from which light-generating region 130 is formed. For InGaN/GaN quantum wells, the spectrum of wavelengths of light generated by region 130 can have a peak wavelength of about 445 nanometers (nm) and a full width at half maximum (FWHM) of about 30 nm.

It is to be noted that the charge carriers in p-doped layer 126 have relatively low mobility compared to the charge carriers in the n-doped semiconductor layer 134. As a result, placing silver layer 126 (which is conductive) along the surface of p-doped layer 128 can enhance the uniformity of charge injection from contact 138 into p-doped layer 128 and light-generating region 130. This can also reduce the electrical resistance of device 100 and/or increase the injection efficiency of device 100. Because of the relatively high charge carrier mobility of the n-doped layer 134, electrons can spread relatively quickly from n-side contact pad 136 throughout layer 134, so that the current density within light-generating region 130 is substantially uniform across region 130. It is also to be noted that silver layer 126 has relatively high thermal conductivity, allowing layer 126 to act as a heat sink for LED 100 (to transfer heat vertically from multi-layer stack 122 to submount 120).

At least some of the light that is generated by region 130 is directed toward silver layer 126. This light can be reflected by layer 126 and emerge from LED 100 via surface 110, or can be reflected by layer 126 and then absorbed within the semiconductor material in LED 100 to produce an electron-hole pair that can combine in region 130, causing region 130 to generate light. Similarly, at least some of the light that is generated by region 130 is directed toward pad 136. The underside of pad 136 is formed of a material (e.g., a Ti/Al/Ni/Au alloy) that can reflect at least some of the light generated by light-generating region 130. Accordingly, the light that is directed to pad 136 can be reflected by pad 136 and subsequently emerge from LED 100 via surface 110 (e.g., by being reflected from silver layer 126), or the light that is directed to pad 136 can be reflected by pad 136 and then absorbed within the semiconductor material in LED 100 to produce an electron-hole pair that can combine in region 130, causing region 130 to generate light (e.g., with or without being reflected by silver layer 126).

As shown in FIG. 2, surface 110 of LED 100 is not flat but consists of a pattern of openings 150. In general, various values can be selected for the depth of openings 150, the diameter of openings 150 and the spacing between nearest neighbors in openings 150 can vary. Examples of patterns transferred into the surface include a variety of patterns that can increase extraction efficiency from the light emitting device. For example, patterns having a detuned quasicrystalline or complex periodic structures, periodic patterns, and non-periodic patterns. Such patterns are disclosed, for example, in application Ser. No. 10/724,004, filed Sep. 26, 2003 which is hereby incorporated by reference. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimidean patterns. Complex periodic pattern can have certain openings with one diameter and other openings with a smaller diameter. As referred to herein, a nonperiodic pattern is a pattern that has no translational symmetry over a unit cell that has a length that is at least 50 times the peak wavelength of light generated by region 130. Examples of nonperiodic patterns include aperiodic patterns, quasicrystalline patterns, Robinson patterns, and Amman patterns. As referred to herein, a detuned pattern is a pattern with nearest neighbors in the pattern have a center-to-center distance with a value between (a−Δa) and (a+Δa), where "a" is the lattice constant for the pattern and "Δa" is a detuning parameter with dimensions of length and where the detuning can occur in random directions. To enhance light extraction from LED 100, detuning parameter, Δa, is generally at least about one percent (e.g., at least about two percent, at least about three percent, at least about four percent, at least about five percent) of ideal lattice constant, a, and/or at most about 25% (e.g., at most about 20%, at most about 15%, at most about 10%) of ideal lattice constant, a. In some embodiments, the nearest neighbor spacings vary substantially randomly between (a−Δa) and (a+Δa), such that the pattern is substantially randomly detuned.

Figure 3A:
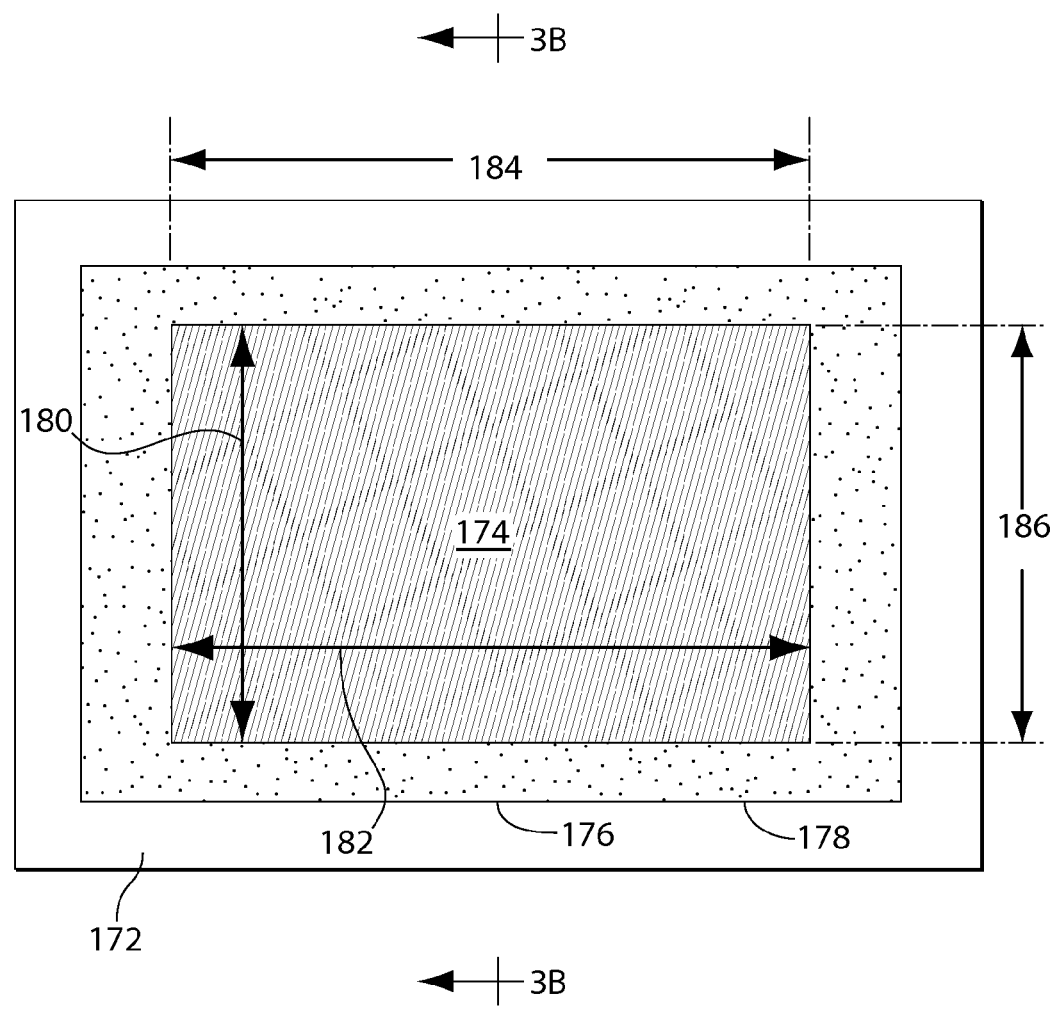
FIG. 3A is a top view a packaged light emitting device.
Figure 3B:
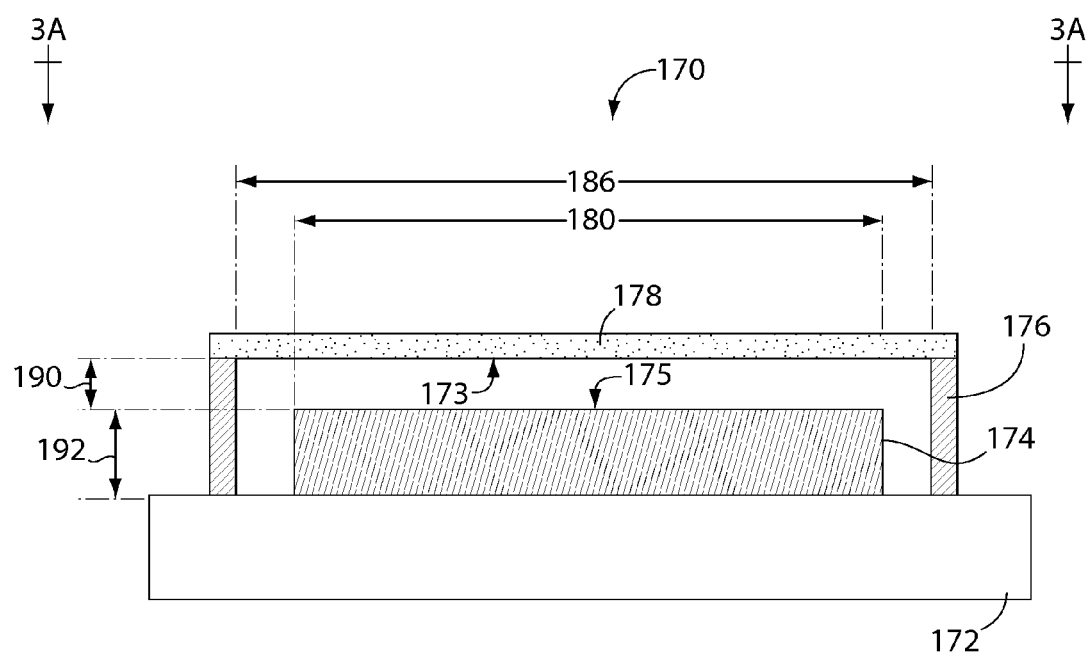
FIG. 3B is a cross-sectional view of a packaged light emitting device of FIG. 3A.

FIGS. 3A and 3B show a top view and side view of an LED 174 in the form of a packaged die 170. The package includes a substrate 172 that supports LED 174. The package also includes a frame 176 and a transparent cover 178 supported by frame 176. Typically, transparent cover 178 is formed of a material that transmits at least about 60% (e.g., at least about 70%, at least about 80%, at least about 90%, at least about 95%) of the light that emerges from LED 174 and impinges on transparent cover 178. Examples of materials from which transparent cover 178 can be formed include glass, silica, quartz, plastic, and polymers. In general, the package should be capable of transmitting light while also providing mechanical and environmental protection of LED 174 and allowing heat generated in LED 174 to be dissipated.

In some embodiments, transparent cover 178 can be coated with one or more anti-reflection coatings to increase light transmission. In some embodiments, additional optical components can be included in or supported by transparent cover 178. Examples of such optical components include lenses, mirrors, reflectors, collimators, beam splitters, beam combiners, dichroic mirrors, filters, polarizers, polarizing beam splitters, prisms, total internal reflection prisms, optical fibers, light guides and beam homogenizers.

In some embodiments, transparent cover 178 is disposed in close proximity to an upper surface 175 of LED 174. For example, in some embodiments, a spacing 190 between upper surface 175 of LED 174 and a lower surface 173 of transparent cover 178 nearest to upper surface 175 of LED 174 can be relatively small. For example, spacing 190 can be from about one micron to about 500 microns (e.g., at most about 500 microns, at most about 400 microns, at most about 300 microns, at most about 250 microns, at most about 200 microns, at most about 150 microns, at most about 100 microns, at most about 50 microns, at most about 25 microns). In some embodiments, transparent cover 178 is disposed in contact with at least a portion of upper surface 175 of LED 174.

In some embodiments, a cross-sectional area of LED 174 can be relatively large. For example, length 180 or width 182 of LED 174 can be at least about one millimeter (e.g., at least about two millimeters, at least about three millimeters, at least about five millimeters, at least about ten millimeters). It can be desirable for spacing 190 between surface 175 of LED 174 and surface 173 of transparent cover 178 to be proportional to the length 180 or width 182 of LED 174. For example, a ratio of length 180 or width 182 of LED 174 to spacing 190 can be at least about five (e.g., at least about five at least about seven, at least about ten, at least about fifteen, at least about twenty, at least about thirty, at least about fifty, at least about seventy-five, at least about one-hundred, at least about two-hundred).

Figure 4A:
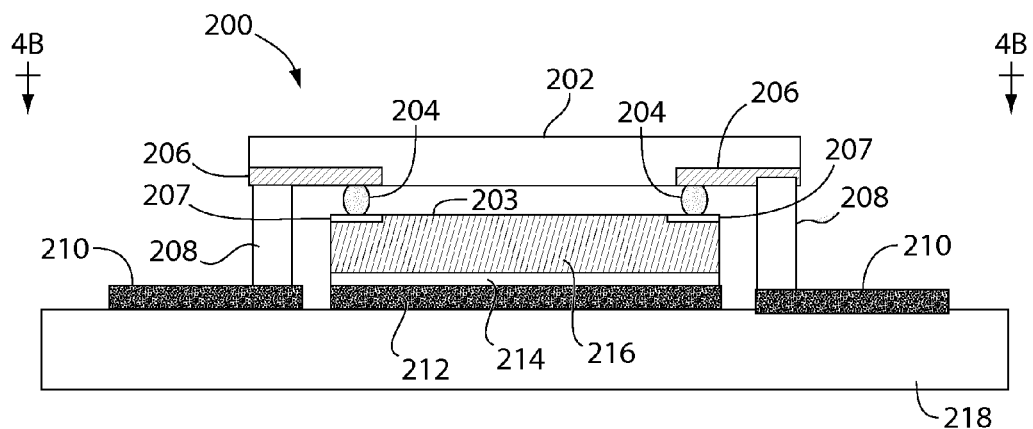
FIG. 4A is a cross-sectional view of a packaged light emitting device.
Figure 4B:
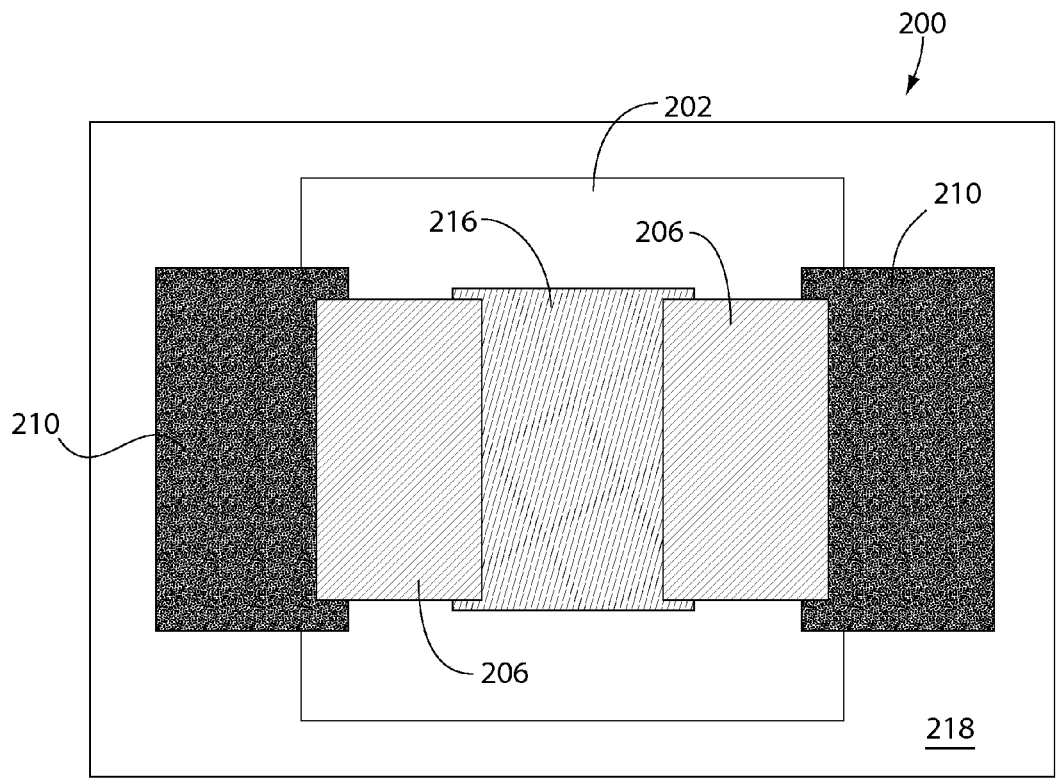
FIG. 4B is a top view of the packaged light emitting device of FIG. 4A.

In some embodiments, forming the electrical contacts to the upper surface 175 of the LED 174 without using wire bonding can allow the transparent cover 178 to be disposed in close proximity to upper surface 175 of the LED 174. FIGS. 4A and 4B show a side view and top view of an LED 216 in the form of a packaged die 200. The package includes a transparent cover 202, a support 208, conductive pads 210, and a substrate 218. LED 216 is attached to substrate 218 using a solder layer 214 (examples of solder include AuSn solder, PbSn solder, NiSn solder, InSn solder, InAgSn solder, and PbSnAg solder) or using an electrically conductive epoxy (e.g., silver filled epoxy). In some embodiments, packaged die 200 can include a thermal pad or other heat dissipation layer 212 (e.g., a silver layer, a copper layer). Heat dissipation layer 212 can have a relatively high thermal conductivity, allowing layer 212 to act as a heat sink for LED 216 (e.g., to transfer heat vertically from LED 216 to substrate 218).

Package 200 is designed to allow electrical current to flow from a pad 210 to a surface 203 of LED 216. Pad 210 is electrically connected to a conductive support 208 such as a metal post. In addition to forming an electrical connection to pad 210, conductive supports 208 also provide physical support for a cover 202. Conductive supports 208 can be constructed in a variety of ways. For example, conductive supports 208 could be constructed by metal plating, solder ball, clips, or by a prefabricated frame. Transparent cover 202 can be pre-patterned with metal contacts 206. Contacts 206 on transparent cover 202 are electrically connected to pads 210 via conductive supports 208. Contacts 206 can be composed of a variety of materials. For example, contacts 206 can be composed of Cu, Ag, Au or blanket transparent metal such as ITO, Au, AuNi. Transparent cover 202 is adhered to LED 216 via solder 204 (e.g., AgSn solder, Au—Sn solder, Pb—Sn solder, Pd—In solder, or Au—Ge solder) forming an electrical current path between contacts 207 on surface 203 of LED 216 and contacts 206 on transparent cover 202. Conductive pads 207 allow current to be spread to the LED surface 203. While FIGS. 4A and 4B show two pads 210, other arrangements are possible. For example, package 200 could include a single pad 210 or more than two pads (e.g., three pads, four pads, five pads, six pads).

Figure 5A:
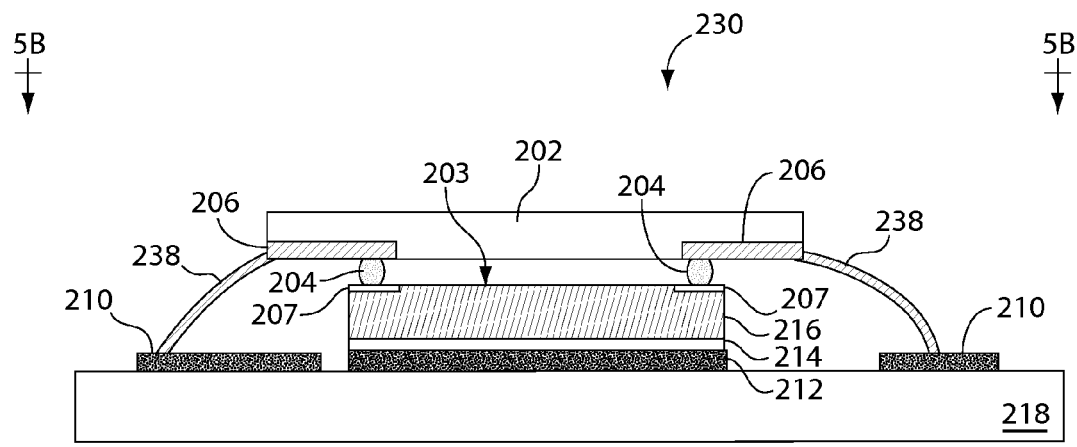
FIG. 5A is a cross-sectional view of a packaged light emitting device.
Figure 5B:
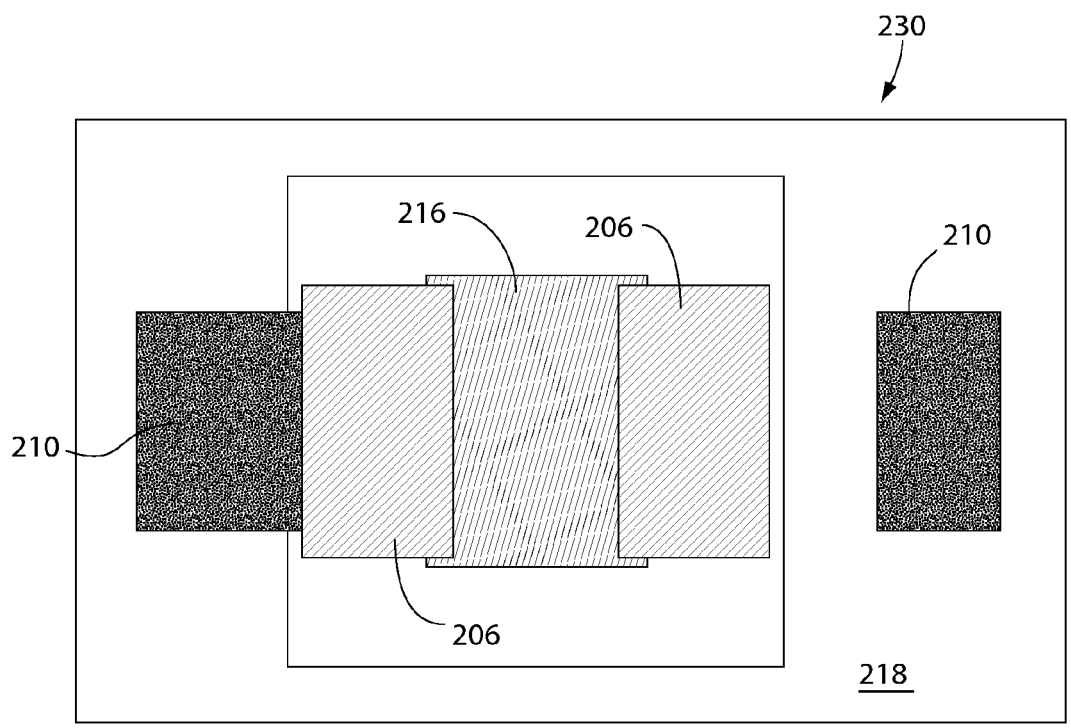
FIG. 5B is a top view of the packaged light emitting device of FIG. 5A.

FIGS. 5A and 5B show a side view and top view of an LED 216 in the form of a packaged device 230. The packaged device 230 includes a transparent cover 202, a conductive connection 238, conductive pads 210, and a substrate 218. LED 216 can be disposed within the package and can be attached to substrate 218 as described above in relation to FIGS. 4A and 4B.

Package 230 is designed to allow electrical current to flow from a pad 210 to a surface 203 of LED 216. Pad 210 is electrically connected to a using a conductive connection 238 such as a metal spring or clip. The metal spring or clip can be composed of a semi-flexible material such that the spring or clip can be bent to allow for differing thicknesses of LED 216. For example, conductive connection 238 can be made of conductive materials such as gold, aluminum, silver, platinum, copper, and other metals or metal alloys. Transparent cover 202 can be pre-patterned with metal contacts 206. Contacts 206 on transparent cover 202 are electrically connected to pads 210 via conductive connection 238. Contacts 206 can be composed of a variety of materials. For example, contacts 206 can be composed of Cu, Ag, Au or blanket transparent metal such as ITO, Au, AuNi. Transparent cover 202 is adhered to LED 216 via solder 204 (e.g., AgSn solder, Au—Sn solder, Pb—Sn solder, Pd—In solder, or Au—Ge solder) forming an electrical current path between contacts 207 on surface 203 of LED 216 and contacts 206 on transparent cover 202. Conductive pads 207 allow current to be spread to the LED surface 203. While FIGS. 5A and 5B show two pads 210, other arrangements are possible. For example, package 230 could include a single pad or more than two pads (e.g., three pads, four pads, five pads, six pads).

Figure 5C:
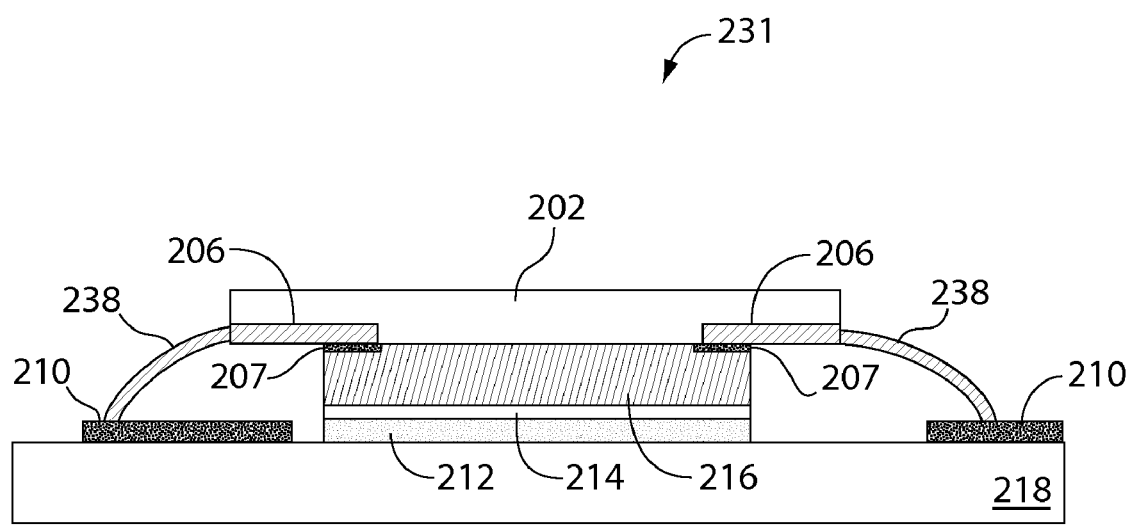
FIG. 5C is a cross-sectional view of a packaged light emitting device.

FIG. 5C shows a side view and top view of an LED 216 in the form of a packaged device 231. The packaged device 230 includes a transparent cover 202, a conductive connection 238, conductive pads 210, and a substrate 218. LED 216 can be disposed within the package and can be attached to substrate 218 as described above in relation to FIGS. 5A and 5B. Package 230 is designed to allow electrical current to flow from a pad 210 to a surface 203 of LED 216. Pad 210 is electrically connected to a using a conductive connection 238 as described above. Transparent cover 202 can be pre-patterned with metal contacts 206. Contacts 206 on transparent cover 202 are electrically connected to contacts 207 on surface 203 of LED 216. For example, contacts 206 on transparent cover 202 can be in direct contact with contacts 207 on surface 203 of LED 216 forming an electrical current path between contacts 207 on surface 203 of LED 216 and contacts 206 on transparent cover 202. In some embodiments, one or both of contacts 206 and 207 may have a roughened surface. It is believed that roughening the surface of one or both of contacts 206 and 207 can facilitate the current flow between contacts 206 and 207.

Figure 6A:
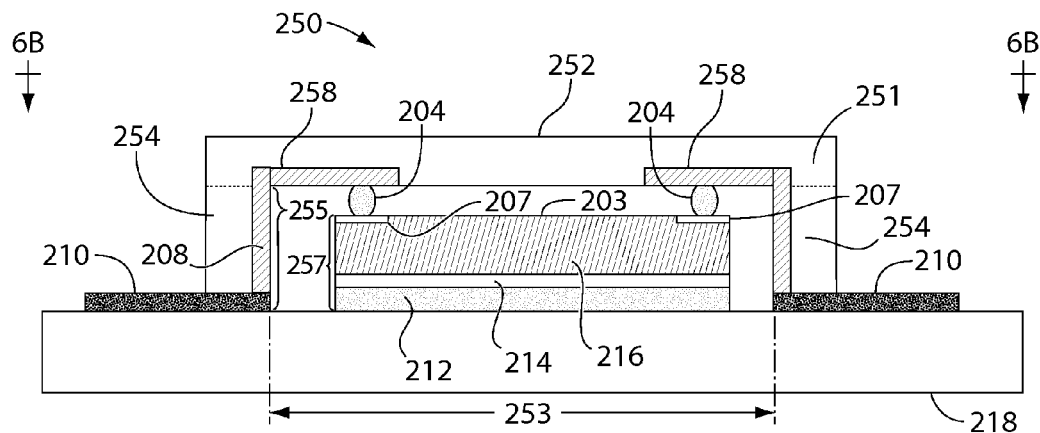
FIG. 6A is a cross-sectional view of a packaged light emitting device.
Figure 6B:
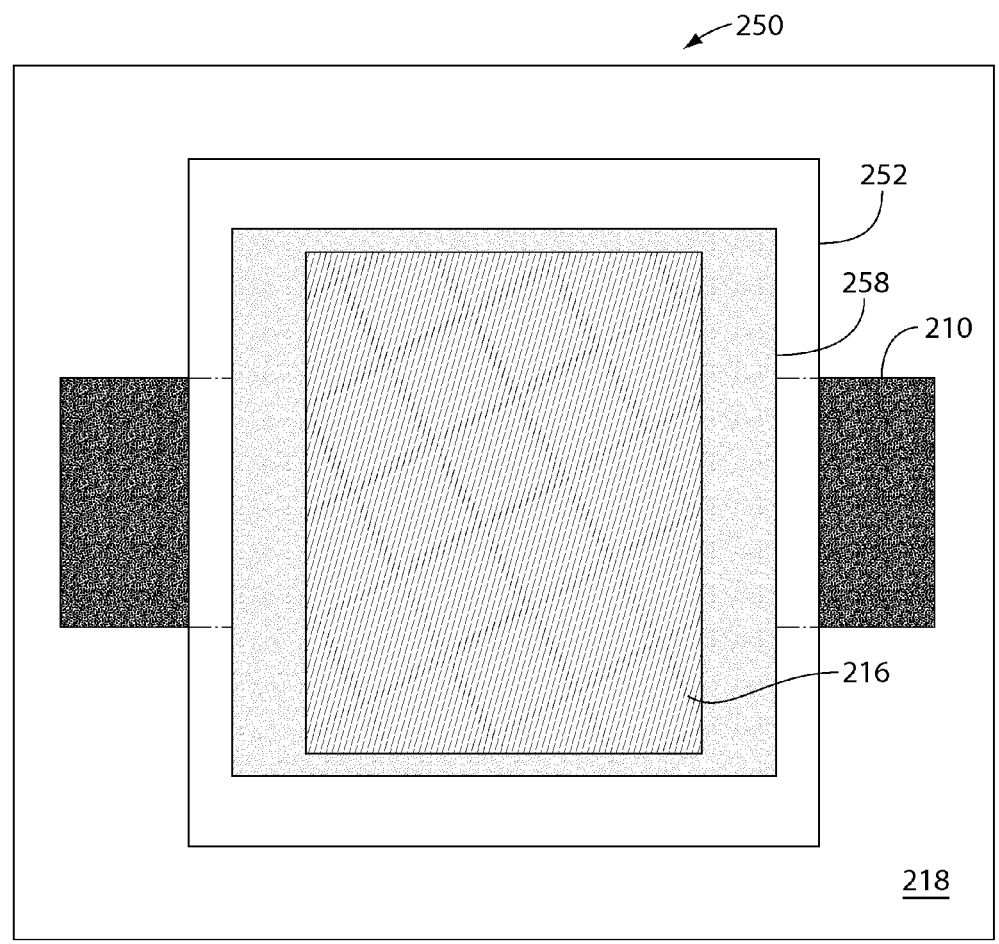
FIG. 6B is a top view of the packaged light emitting device of FIG. 6A.

FIGS. 6A and 6B show a side view and top view of an LED 216 in the form of a packaged device 250 that includes contacts 258 and a transparent cover 252 having a recessed region 253. LED 216 can be attached to a package substrate 218 as described above in relation to FIGS. 4A and 4B. Packaged device 250 includes a transparent cover 252 that is self supporting. Transparent cover 252 includes a region 251 about parallel to the surface of LED 216 through which light from LED 216 emerges and support regions 254 about perpendicular to the about parallel region 251 forming a recessed region 253 in transparent cover 252. A recess depth 255 of recess region 253 can be equal to or slightly larger than thicknesses 257 of LED 216, heat dissipation layer 212, and solder layer 214 combined. For example, recess depth 255 can be from about five microns to about 400 microns greater than thicknesses 257.

Package 250 is designed to allow electrical current to flow from a pad 210 to a surface 203 of LED 216. Pad 210 is electrically connected to conductive contacts 258 on transparent cover 252. The conductive contacts 258 extend along regions 254 of transparent cover 232 and a portion of region 251 of transparent cover 252. Transparent cover 252 is aligned such that the conductive contacts 258 are aligned with metal contact pads 207 on the surface of LED 216. A conductive adhesive 204 (e.g., solder, metal filled epoxy) can be used to form an electrical connection between conductive contacts 258 on transparent cover 232 and contact pads 207 on LED 216.

Figure 7A:
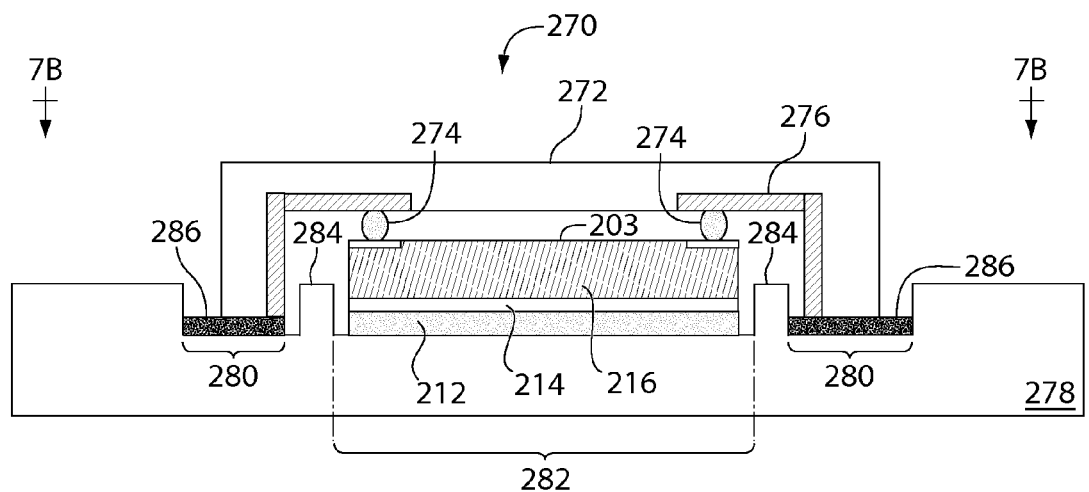
FIG. 7A is a cross-sectional view of a packaged light emitting device.
Figure 7B:
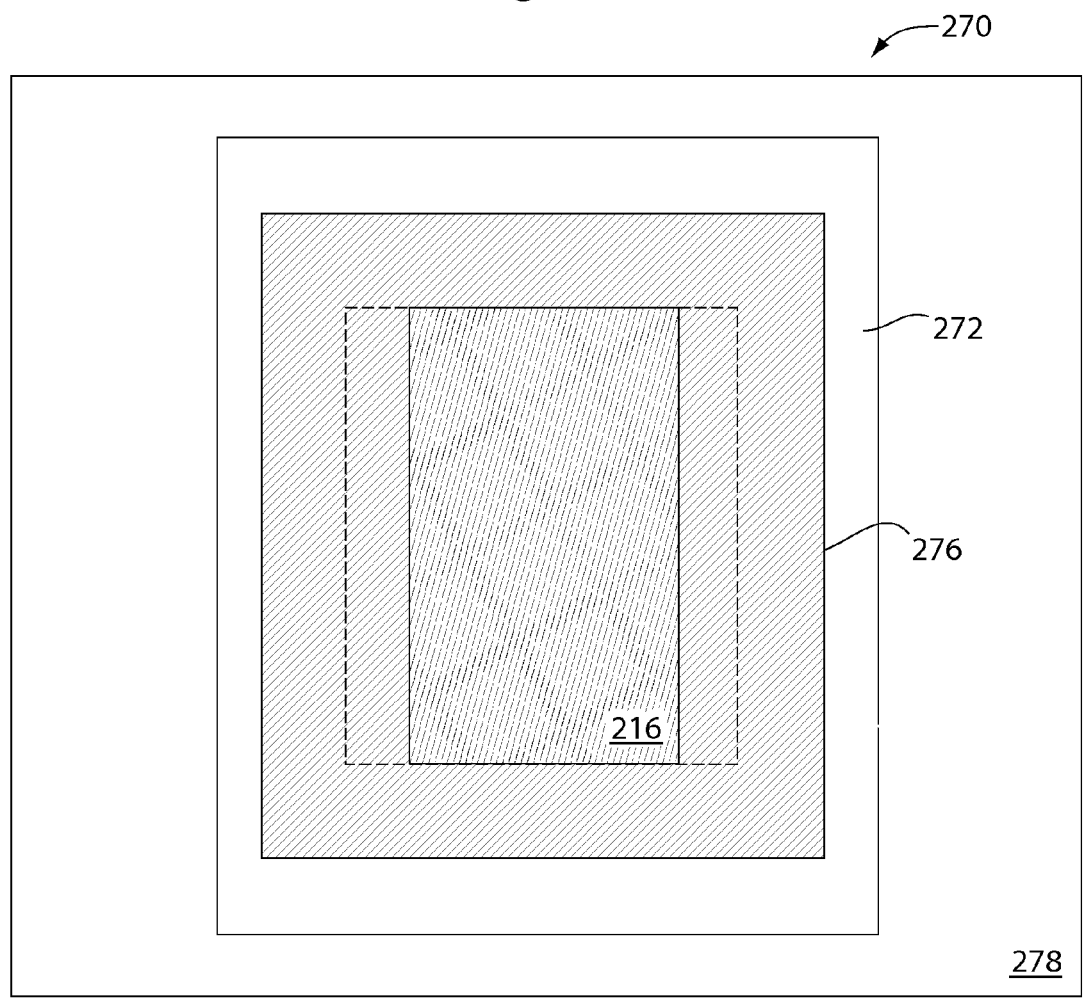
FIG. 7B is a top view of the packaged light emitting device of FIG. 7A.

FIGS. 7A and 7B show a side view and top view of an LED 216 in the form of a packaged device 270. Packaged device 270 includes a recessed transparent cover 272 as described above in relation to FIGS. 6A and 6B. Packaged device 270 also includes a substrate 278 having etched regions 280 and 282 that provide self-alignment of LED 216 and transparent cover 272. Etched region 282 is slightly larger than the size of LED 216 and LED 216 is disposed in etched region 282. Etched region 280 provides alignment for transparent cover 272. Etched region 280 can include a metal contact layer 286 disposed in the bottom of etched region 280. Etched region 280 aligns transparent cover 272 with LED 216.

Figure 8A:
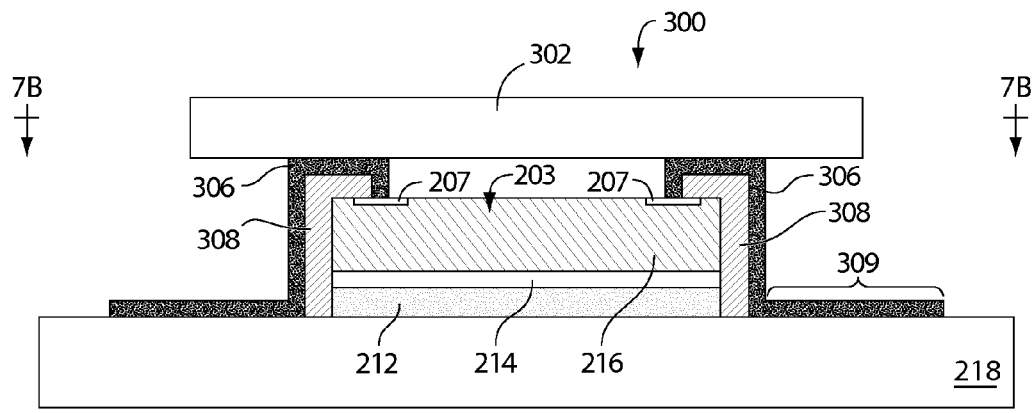
FIG. 8A is a cross-sectional view of a packaged light emitting device.
Figure 8B:
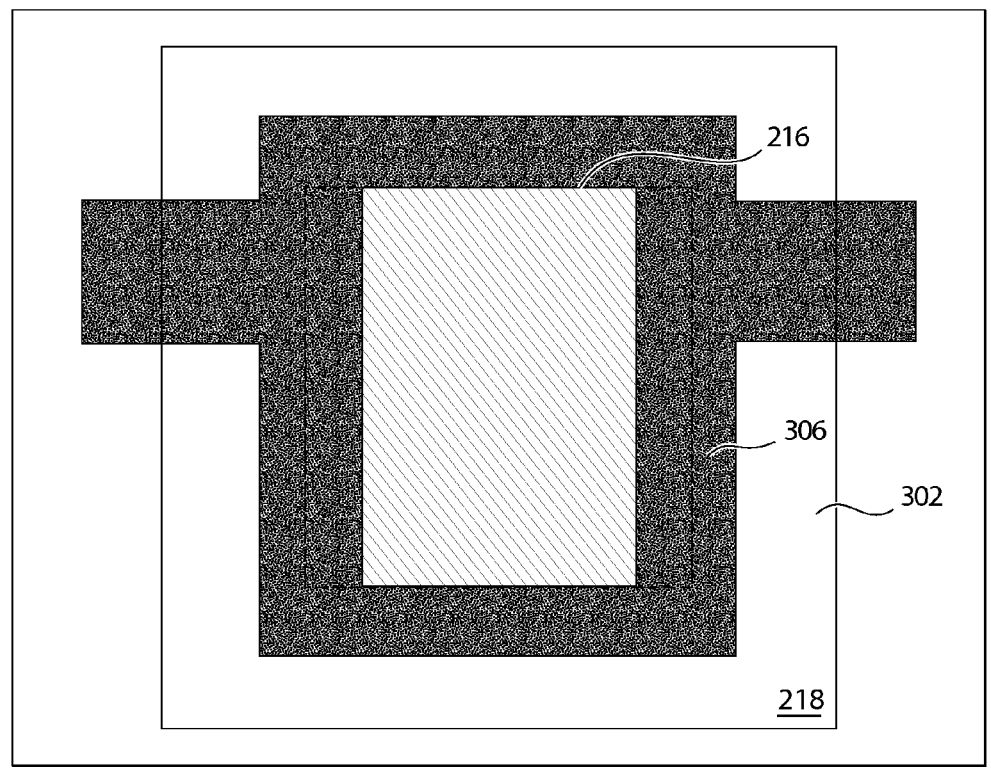
FIG. 8B is a top view of the packaged light emitting device of FIG. 8A.

While embodiments have been described in which the transparent cover includes a metal layer, in some embodiments, the transparent cover is not metallized. For example, as shown in FIGS. 8A and 8B, a packaged LED 300 includes LED 216, a substrate 218, an insulating layer 308, conductive contacts 306, and a transparent cover 302. Package 300 is designed to allow electrical current to flow from a portion 309 of conductive contacts 306 disposed on substrate 218 to a surface 203 of LED 216. Insulating layer 308 is disposed on a portion of the top surface 203 and sidewalls of LED 216 and conductive contacts 306 are disposed on insulating layer 308. For example, subsequent to the deposition of insulating layer 308, conductive contacts 306 can be formed on the surface of the insulating layer 308 to provide an electrical connection between contact 207 on the surface of LED 216 and portion 309 of conductive contacts 306. Transparent cover 302 can be supported by conductive contacts 306 and provides physical protection for LED 216.

While embodiments have been described in which a single LED is contained in the package, in some embodiments, multiple LEDs can be arranged to form an array of LEDs. For example, in some embodiments, multiple individual LEDs can be packed closely together in an array. Closely packing multiple LEDs to form an array can provide various advantages. For example, if one LED does not function (e.g., due to a defect or malfunction), the failure of the LED does not significantly diminish the performance of the array because the individual devices are closely packed. Closely packing LEDs can increase light output for a given array area by reducing the spacing between the LEDs.

In general, the number of LEDs and the placement of each LED in the array of LEDs can be selected as desired.

Figure 9:
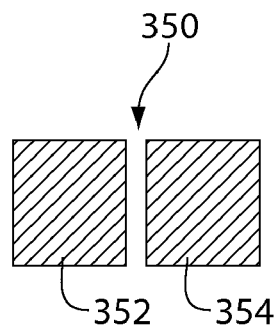
FIG. 9 is a top view of an array of light emitting devices.
Figure 10:
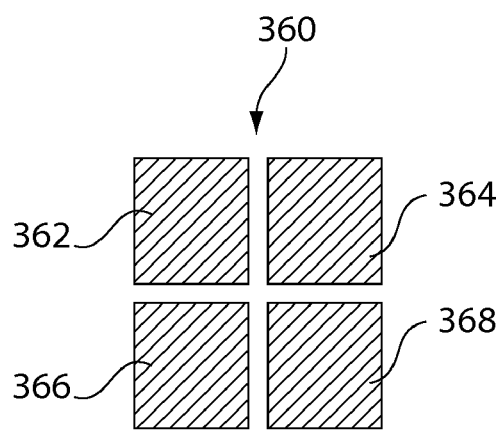
FIG. 10 is a top view of an array of light emitting devices.
Figure 11:
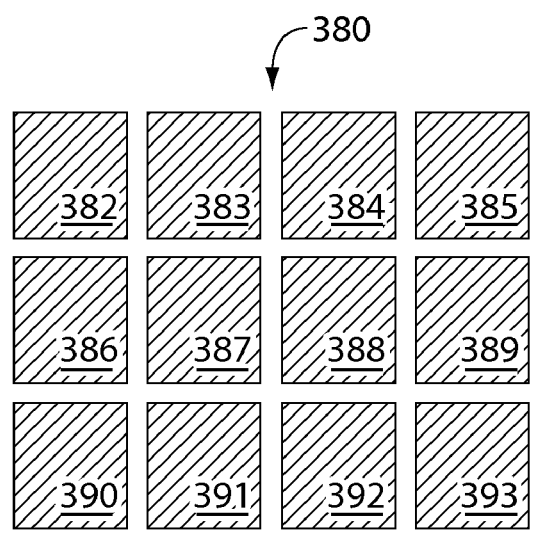
FIG. 11 is a top view of an array of light emitting devices.
Figure 12:
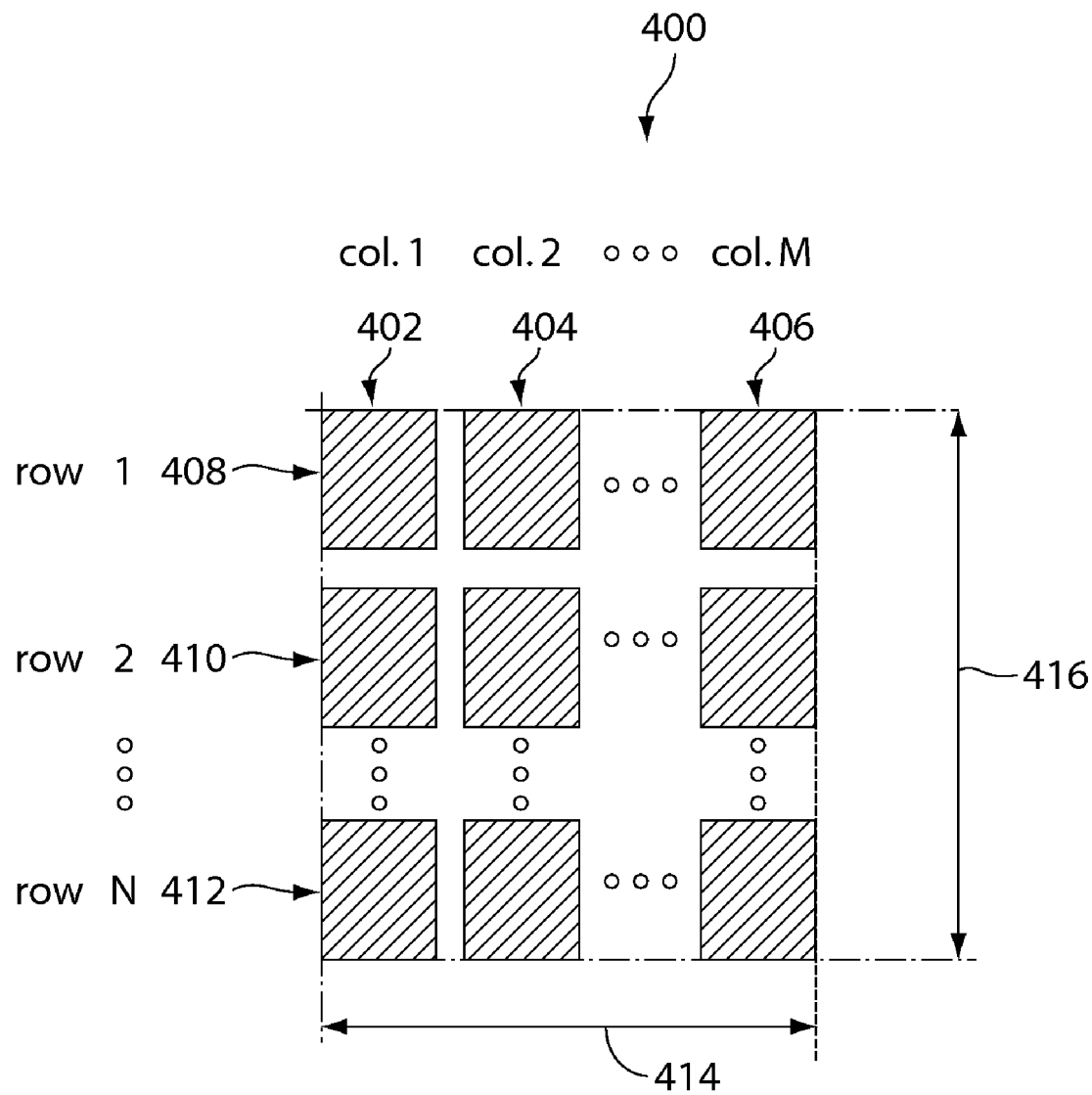
FIG. 12 is a top view of an array of light emitting devices.

FIGS. 9, 10, 11, and 12 show exemplary light emitting device (LED) die orientations for multi-chip arrays. FIG. 9 shows an array 350 of light emitting devices that includes two LEDs 352 and 354 arranged in a single row. FIG. 10 shows an array 360 of light emitting devices that includes four LEDs 362, 364, 366, and 368 arranged in a 2×2 matrix (i.e., arranged in two rows and two columns). FIG. 11 shows an array 380 of light emitting devices that includes nine LEDs 382, 383, 384, 385, 386, 387, 388, 389, 390, 391, 392, and 393 arranged in a 3×4 matrix (i.e., arranged in three rows and four columns). In general, the number of rows and columns in the matrix of LEDs can be selected as desired. For example, FIG. 12 shows an array 400 of N times M LEDs arranged in an N by M matrix having N rows (e.g., a first row 408, a second row 410, and an $N^{th}$ row 412) and M columns (e.g., a first column 402, a second column 404, and an $M^{th}$ column 406) of LEDs (where N and M are both positive integers). In some embodiments, the number of LEDs and the placement of each LED in the multi-chip array can be selected to form a desired aspect ratio (as defined by the length 414 of array 400 to the width 416 of array 400). The aspect ratio of array 400 can be, for example, 16×9, 4×3, 1920×1080, 640×480, 800×600, 1024×700, 1024×768, 1024×720, 1280×720, 1280×768, 1280×960, or 1280×1064. A desired aspect ratio can be obtained by appropriately sizing and/or spacing LED die.

Figure 13:
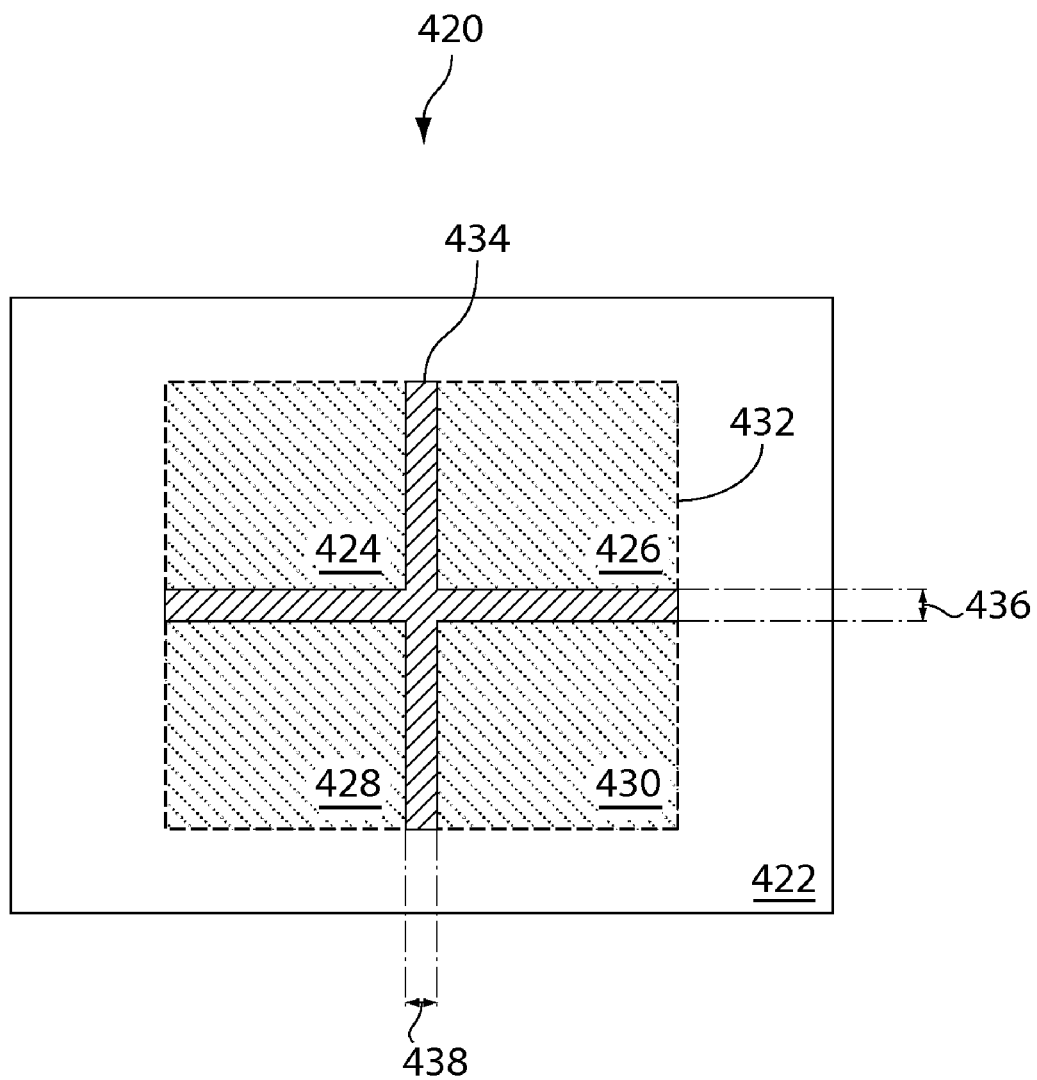
FIG. 13 is a top view of an array of light emitting devices.

As described above, multiple LEDs can be packed closely together in an array. As shown in FIG. 13 multiple LEDs 424, 426, 428, and 430 are supported by a substrate 422. The LEDs can be positioned on substrate 422 to reduce or minimize the spacing between adjacent LEDs.

In some embodiments, LEDs 424, 426, 428, and 430 can be arranged such that a spacing between the nearest edges of neighboring die in the array of LEDs (e.g., spacing 436 and/or spacing 438) is relatively small. For example, spacing 436 or 438 can be at most about 250 microns (e.g., at most about 200 microns, at most about 150 microns, at most about 100 microns, at most about 75 microns, at most about 50 microns).

In some additional embodiments, LEDs 424, 426, 428, and 430 can be arranged on substrate 422 to reduce or minimize the amount of surface area disposed between LEDs 424, 426, 428, and 430 (as indicated by area 434). In general, a total area of the LED array can be defined by the area enclosed by an outer perimeter of the LEDs (e.g., as indicated by dashed line 432). A total surface area of the LEDs can be about equal to the sum of the area of each LED in the array of LEDs (e.g., a sum of the area of LEDs 424, 426, 428, and 430). In a close packed array of LEDs, the LEDs in the array of light emitting devices can be positioned such that a ratio of a sum of a total area of all of the light emitting devices (e.g., a sum of the areas LEDs 424, 426, 428, and 430) in the array to the total area 432 can be at least about 0.8 (e.g., at least about 0.85, at least about 0.9, at least about 0.95). In some embodiments, ratio of a sum of a total area of all of the light emitting devices in the array to the total area 432 can be at least about 0.5 (e.g., at least about 0.6, at least about 0.7).

Close spacing of the LEDs in an array of LEDs can be achieved with various techniques. In some embodiments, an electrical contact to the n-doped or p-doped layer of the LED is formed through a conductive substrate or submount. The conductive substrate or submount is attached to conductive contact pads supported by the package, for example, using a conductive paste (e.g., a metal filled paste), solder, or conductive tape. In some embodiments, spacing 438 or 436 can be limited by the spread of the material used to attach the LED to the substrate or submount into surrounding areas which can cause an electrical short between the die. Various approaches can be used to minimize the spread of the die attach material.

Figure 14A:
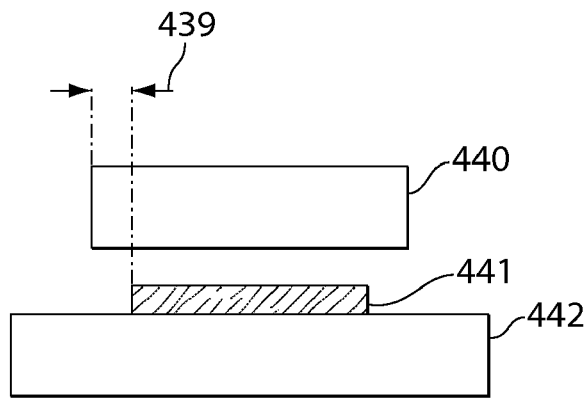
FIGS. 14A-C are cross-sectional views of a light emitting device and a package.
Figure 14B:
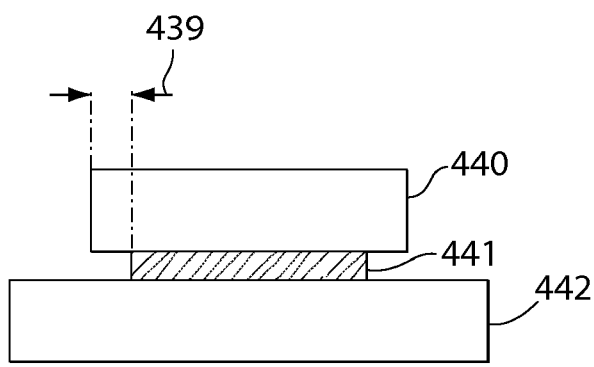
Figure 14C:
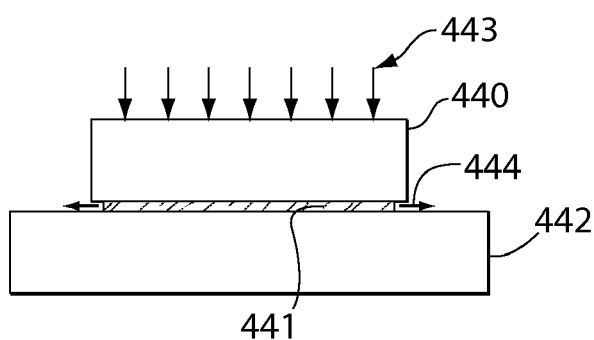

FIGS. 14A-14C show an exemplary process for attaching an LED die 440 to a package substrate 442 using a layer of die attach material 441. The die attach material 441 is deposited on package substrate 442 in a location corresponding to a desired placement of the die 440. The area coverage of die attach material 441 is less than the area of die 440 such that a portion 439 of the LED is not initially in contact with the die attach material (as shown in FIGS. 14A and 14B). As shown in FIG. 14C, when pressure and/or heat are applied to the LED and/or the package substrate (as indicated by arrows 443) the die attach material 441 spreads laterally as indicated by arrows 444. Because die attach material 441 did not extend to the edge of the die prior to the application of pressure and heat, the die attach material can spread laterally and be contained in an area of the substrate 442 disposed under die 440.

Figure 15:
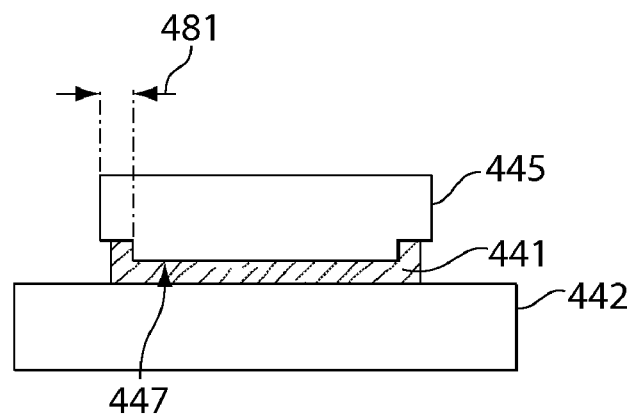
FIG. 15 is a cross-sectional view of a packaged light emitting device.
Figure 16:
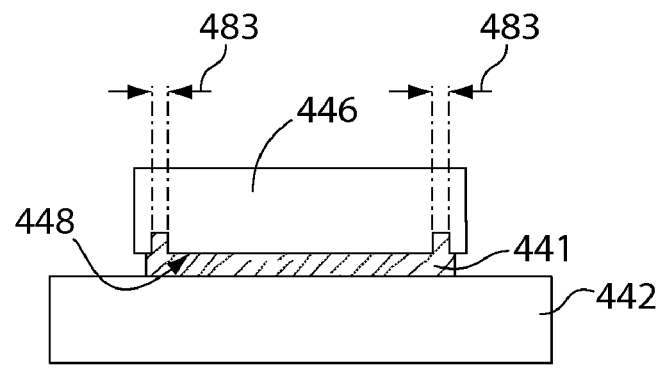
FIG. 16 is a cross-sectional view of a packaged light emitting device.
Figure 17:
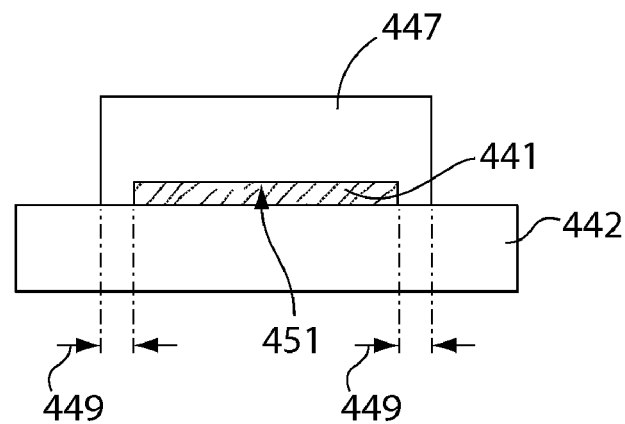
FIG. 17 is a cross-sectional view of a packaged light emitting device.

FIGS. 15-17 show exemplary embodiments where spreading of the die attach material 441 is controlled by patterning an underside of the die (e.g., underside 447 of die 445 or underside 448 of die 446). The underside 447 or 448 is patterned with grooves 481 and 483 that collect excess attach material 441 as the material spreads due to the application of heat and/or pressure. FIG. 17 shows an exemplary embodiment where ridges 449 are patterned into the underside 451 of a die 447. Ridges 449 form a barrier to the spreading of die attach material 441.

While the embodiments shown in FIGS. 14-17 show a single die attached to a substrate using a die attach material, multiple die could be attached to the substrate using the die attach material. In some embodiments, attaching the die using the arrangements shown in FIGS. 14-17 allows multiple die to be closely spaced on a substrate without shorting the die.

Figure 18:
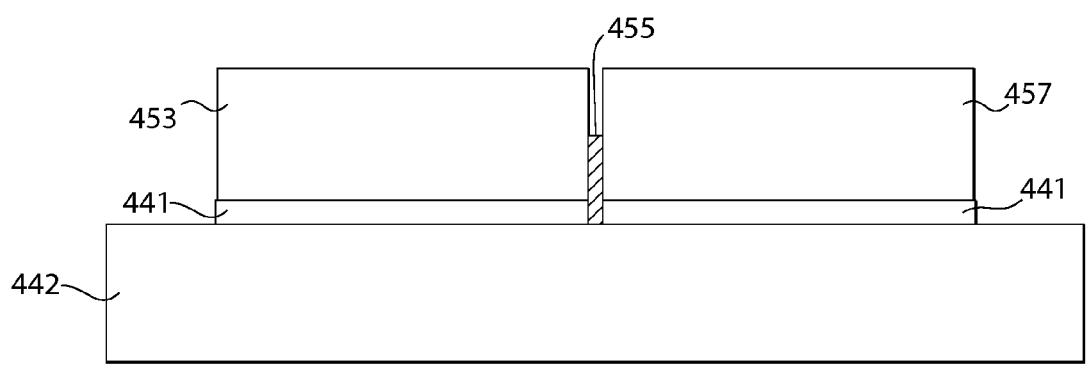
FIG. 18 is a cross-sectional view of a packaged light emitting device

FIG. 18 shows an exemplary embodiment in which an insulating region 455 is disposed between LED 453 and LED 455. The insulating region 455 is supported by a substrate 442 and controls the spreading of the die attach material 441. For example, when the die attach material spreads laterally, the insulating region 455 forms a barrier that limits spreading. The insulating region 455 can also aid in assembly and alignment of LEDS 453 and 457.

Figure 19:
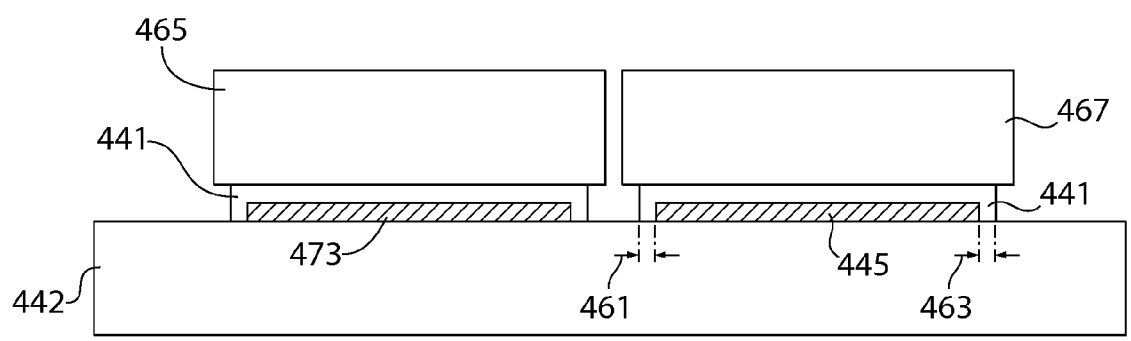
FIG. 19 is a cross-sectional view of a packaged light emitting device

FIG. 19 shows a layer 473 supported by a package substrate 442 which can control the lateral spreading of the die attach material 441. Layer 473 can be formed of a rigid or semi-rigid material that does not flow with the application of heat and pressure typical for bonding the LEDs 465 and 467 to substrate 442. The area coverage of layer 473 is less than the area of LEDs 465 and 467 such that a portion 463 of the LED extends past the patterned region 473. When pressure and heat are applied to the LED and/or the package substrate the die attach material 441 spreads laterally. Because the area of layer 473 is smaller than the area of LEDs 465 and 467, the excess die attach material 441 spreads over the edges of the layer 473 (as indicated by region 461). In some embodiments, the area of layer 473 can be selected to be sufficiently smaller than the area of the LED such that the lateral spreading of die attach material 441 can be limited to a region of the substrate 442 under the die.

Figure 20A:
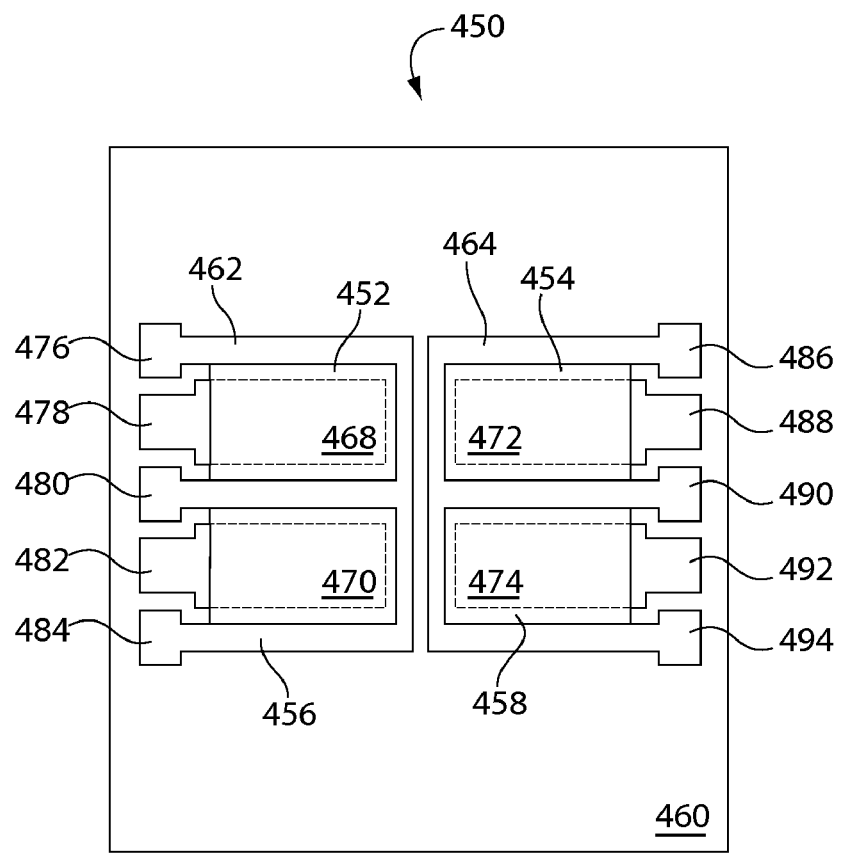
FIG. 20A is a top view of an array of light emitting devices.
Figure 20B:
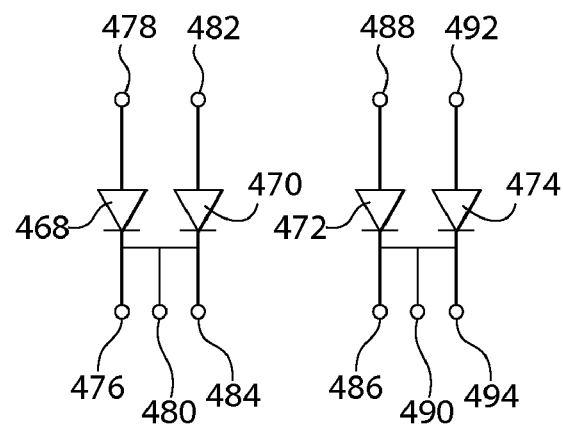
FIG. 20B is circuit diagram corresponding to the array of FIG. 20A.

FIGS. 20A and 20B show an exemplary a package 450 including an array of four LEDs 452, 454, 456, and 458 arranged in a two by two matrix. The package includes a package substrate 460 (e.g., a board composed of AlN, Cu), n-contact leads 462 and 464 and p-contact leads 468, 470, 472, and 474. The contact leads include solder pads 476, 478, 480, 482, 484, 486, 490, 492, and 494 for external wiring. Each p-contact is addressed separately while the n-contacts are connected in sets of two (e.g., n-contacts for LEDs 452 and 456 are connected and n-contacts for LEDs 454 and 458 are connected). As a result, vertical die are connected in parallel (shown schematically in FIG. 20B).

LEDs may or may not be encapsulated. An optional window (not shown) can cover all, some, or one of the die(s) on substrate 460. In some embodiments, a window or encapsulation can include additional optics, e.g., patterning, filters, phosphor, lenses, openings, and the like. While FIG. 20A shows a schematic representation of an array of LEDs 452, 454, 456, and 458 where the vertical die are connected in parallel, in some embodiments LEDs 452, 454, 456, and 458 are not in parallel, but are each individually addressed.

Figure 21:
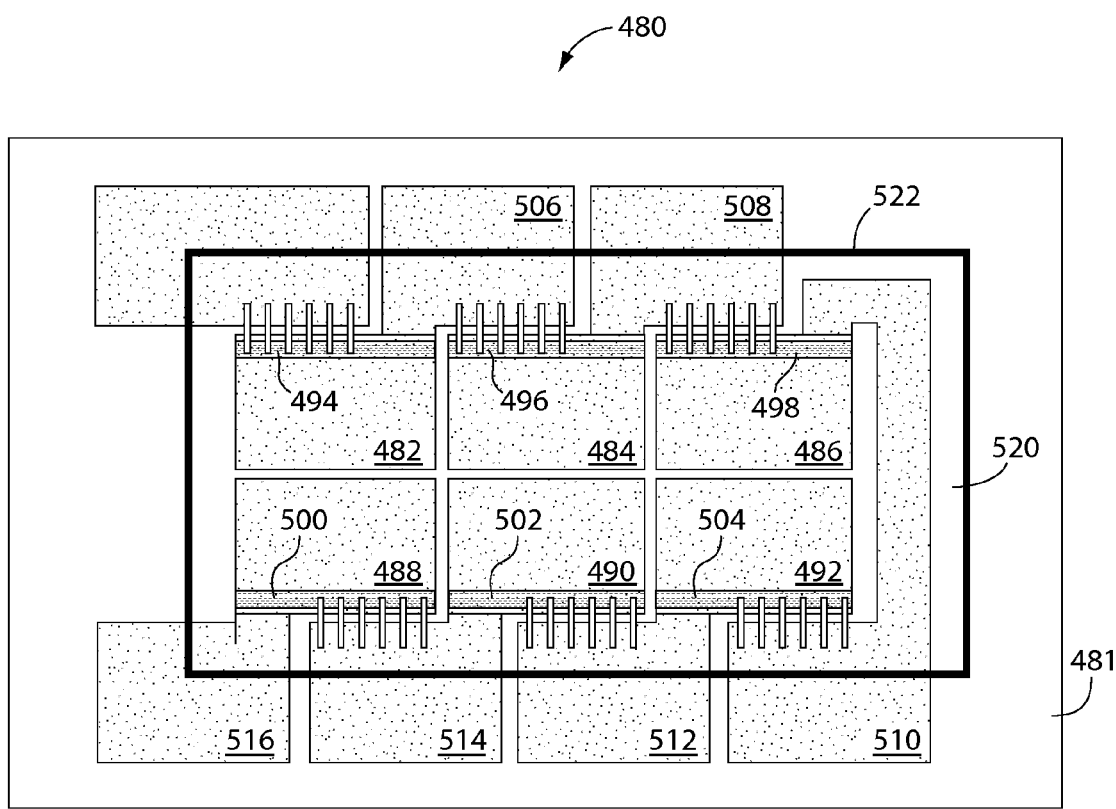
FIG. 21 is a top view of an array of light emitting devices.

FIG. 21 shows an exemplary a package 480 including an array of six LEDs 482, 484, 486, 488, 490, and 492 supported by a package substrate 481 and arranged in a two by three matrix. As described above, the array of LED die can be arranged such that the combined emission area forms a desired aspect ratio. LEDs 482, 484, 486, 488, 490, and 492 are connected in series. N-contact pads 494, 496, 498, 500, 502, and 504 can be electrically connected to a network of contacts lines or fingers that extend over the surface of LEDs 482, 484, 486, 488, 490, and 492 to facilitate better current spreading. To maintain the series circuit, n-pads 494, 496, 498, 500, 502, and 504 are connected (e.g., via wirebonding, patterned interconnects, metallized window) to p-contact pads 506, 508, 510, 512, 514, and 516 which access a p-doped region on an under side of the device. In some embodiments, package 480 also includes a transparent cover 520 supported by a frame 522 (e.g., as described above).

Figure 22:
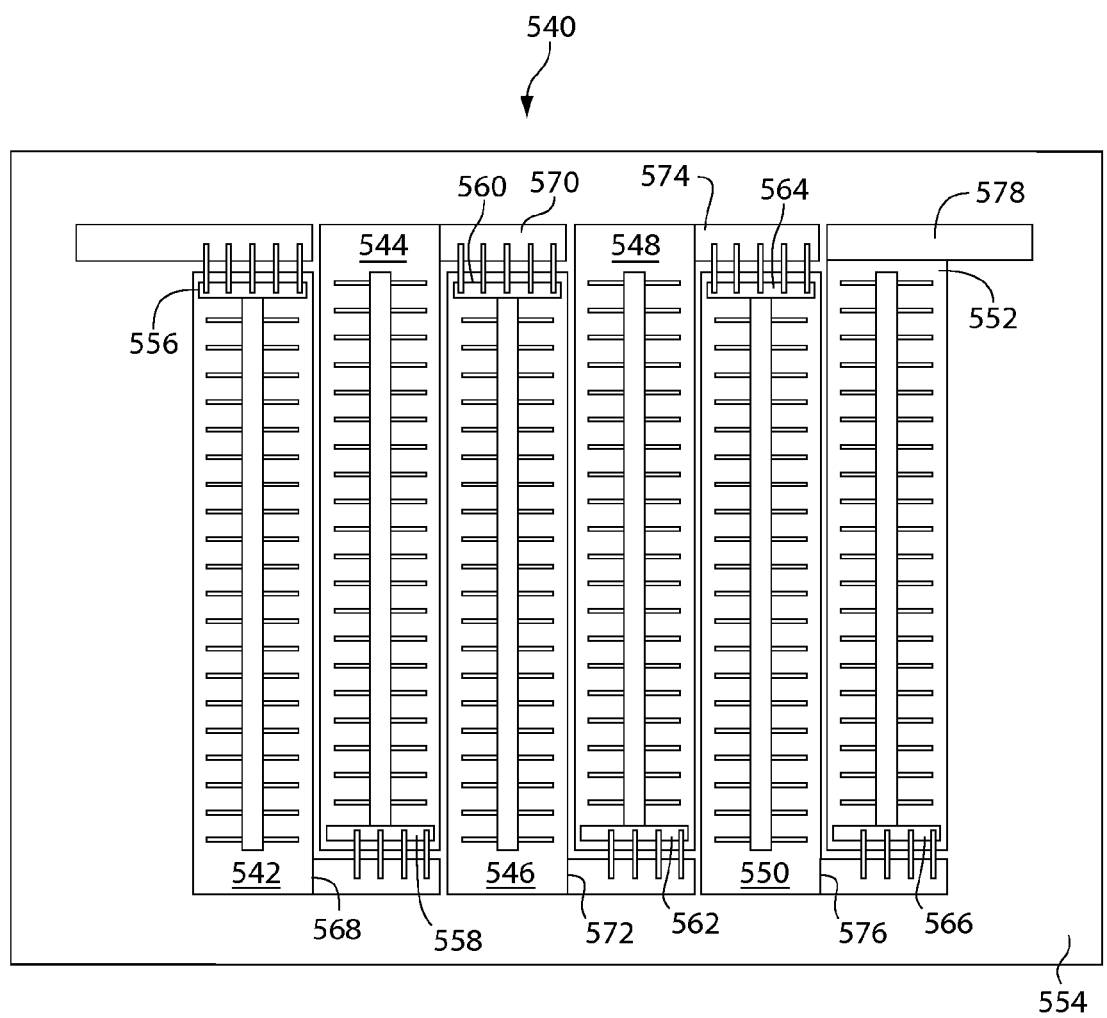
FIG. 22 is a top view of an array of light emitting devices.

FIG. 22 shows an exemplary a die layout 540 including an array of six LEDs 542, 544, 546, 548, 550, and 552 supported by a package substrate 554 and arranged in a one by six matrix. LEDs 542, 544, 546, 548, 550, and 552 are connected in series. To maintain the series connection, n-pads 556, 558, 560, 562, 564, and 566 are connected (e.g., via wirebonding, patterned interconnects, metallized window) to p-contact pads 568, 570, 572, 574, 576 and 578 which access a p-doped region on an under side of LEDs 542, 544, 546, 548, 550, and 552 respectively.

In some embodiments, the transparent cover can be patterned and/or contain optical components, for example, PL, color filter(s), polarization, phosphor layer(s), and ARC. In some embodiments, a window is made of a transparent material which is thermally conductive (e.g., diamond, sapphire)

In some embodiments, the package can include a heat transfer interface. A heat transfer interface could incorporate pattering (mesas, groves) to increase thermal contact and reduce voids during adhesion.

In some embodiments, the packages can be mounted to core board and may or may not include heat extraction device (e.g., an additional heat-sink, a thermoelectric cooler, fluid convection tubes, and the like).

What is claimed is:

1. A system comprising:
    an LED having an edge, the LED being capable of emitting light; and
    a layer positioned at a distance from a surface of the LED, the distance being at most about 10% of the length of the edge, the layer being configured so that at least about 75% of the light that emerges from the LED and impinges on the layer passes through the layer,
    wherein the layer is a window of a package and includes an electrical contact, and
    the package further comprises a substrate and a conductive pad on the substrate,
    wherein the electrical contact of the layer is electrically connected to the conductive pad of the package via a metal spring or clip.

2. The system of claim 1, wherein the LED comprises a multi-layer stack of materials comprising a first layer supported by a light generating region, a surface of the first layer being configured so that light generated by the light generating region can emerge from the LED via a surface of the first layer.

3. The system of claim 2, wherein the surface of the first layer includes a plurality of holes arranged according to a nonperiodic pattern.

4. The system of claim 1, wherein the LED has an edge that is at least about one millimeter long.

5. The system of claim 1, wherein an aspect ratio of the surface of the LED is about 4×3.

6. The system of claim 1, wherein an aspect ratio of the surface of the LED is about 16×9.

7. The system of claim 1, further comprising a cooling system configured so that, during use, the cooling system regulates a temperature of the LED.

8. The system of claim 1, wherein the LED includes an electrical contact and the electrical contact of the layer is electrically connected to the electrical contact of the LED.

9. The system of claim 8, wherein the electrical contact of the layer is patterned.

10. The system of claim 8, wherein the electrical contact of the layer is electrically connected to the electrical contact of the LED via conductive supports.

11. The system of claim 10, wherein the conductive supports comprise solder.

12. The system of claim 1, wherein the layer comprises glass.

13. The system of claim 1, wherein the LED is free of wire bonds.

14. The system of claim 1, wherein the LED includes a light generating region comprising quantum wells.

* * * * *